United States Patent [19]

Birgenheier et al.

[11] Patent Number: 5,187,719
[45] Date of Patent: Feb. 16, 1993

[54] METHOD AND APPARATUS FOR MEASURING MODULATION ACCURACY

[75] Inventors: Raymond A. Birgenheier; Richard P. Ryan, both of Spokane, Wash.

[73] Assignee: Hewlett-Packard Company, Palo Alto, Calif.

[21] Appl. No.: 559,313

[22] Filed: Jul. 30, 1990

Related U.S. Application Data

[63] Continuation-in-part of Ser. No. 297,357, Jan. 13, 1989, Pat. No. 5,001,724.

[51] Int. Cl.$^5$ .......................... H04B 3/46; H04B 17/00
[52] U.S. Cl. ........................................ 375/10; 375/39; 375/42; 375/94; 375/96; 375/118; 455/67.1; 455/115; 455/226; 332/150
[58] Field of Search .................. 375/10, 15, 39, 42, 375/56, 60, 94, 96, 98, 118; 455/70, 71, 67, 115, 116, 126, 226; 332/150

[56] References Cited

U.S. PATENT DOCUMENTS

| | | | |
|---|---|---|---|
| 4,027,250 | 5/1977 | Lang | 375/39 |
| 4,410,764 | 10/1983 | Werth et al. | 455/116 |
| 4,514,855 | 4/1985 | Lang et al. | 375/118 |
| 4,618,999 | 10/1986 | Watkinson | 455/126 |
| 4,675,881 | 6/1987 | Chung | 375/110 |
| 4,700,151 | 10/1987 | Nagata | 455/126 |
| 4,771,438 | 9/1988 | Nash | 375/15 |
| 4,887,280 | 12/1989 | Reisenfeld | 375/10 |
| 4,969,160 | 11/1990 | Kingston | 375/110 |
| 5,001,724 | 3/1991 | Birgenheier et al. | 375/10 |

OTHER PUBLICATIONS

Birgenheier, "Technique for Measuring Phase Accuracy and Amplitude Profile of Continuous--Phase-Modulated Signals", Hewlett-Packard, Apr., 1989, pp. 1-21.
IEA/TIA Interim Standard EIA/TIA/IS-54-A, Mar., 1991, pp. 17-21.
TR45.3, Project No. 2216, Cellular System, Recommended Minimum Performance Standards, Mar., 1991, pp. 41-43.
TR45.3, Project No. 2217, Digital Cellular Systems, Recommended Minimum Performance Standards, Mar., 1991, pp. 30-31.
GSM Rec. 05.05 Version 3.13.0, Feb. 6, 1990, §4.6-4.7.2.
GSM 05.05. (GSM 11.10), Updated Oct., 1991, Version 3.6.0, Part II.3, pp. 1-2.
GSM 11.10, Mar., 1991, Version 3.4.0, Part II.3, p. 3.
GSM 11.20, Mar., 1991, Version 3.4.0, §2.1.6.2, pp. 2.4-2.5.

Primary Examiner—Curtis Kuntz
Assistant Examiner—Young Tse

[57] ABSTRACT

A method and apparatus for determining the phase and amplitude accuracy of continuous-phase-modulated signals is described. A modulated RF signal generated by a transmitter is down converted to a relatively low intermediate frequency which is filtered and sampled by a high sampling rate analog-to-digital converter. A digital signal processor processes the digital signals to produce a measured phase function corresponding to the modulated RF signal. From the measured amplitude and phase functions, an estimate of the ideal reference phase function corresponding to the modulated RF signal is calculated and synthesized. The reference phase function is compared to the measured phase function to determine the phase function from which the modulated RF signal phase error and frequency error are computed.

16 Claims, 11 Drawing Sheets

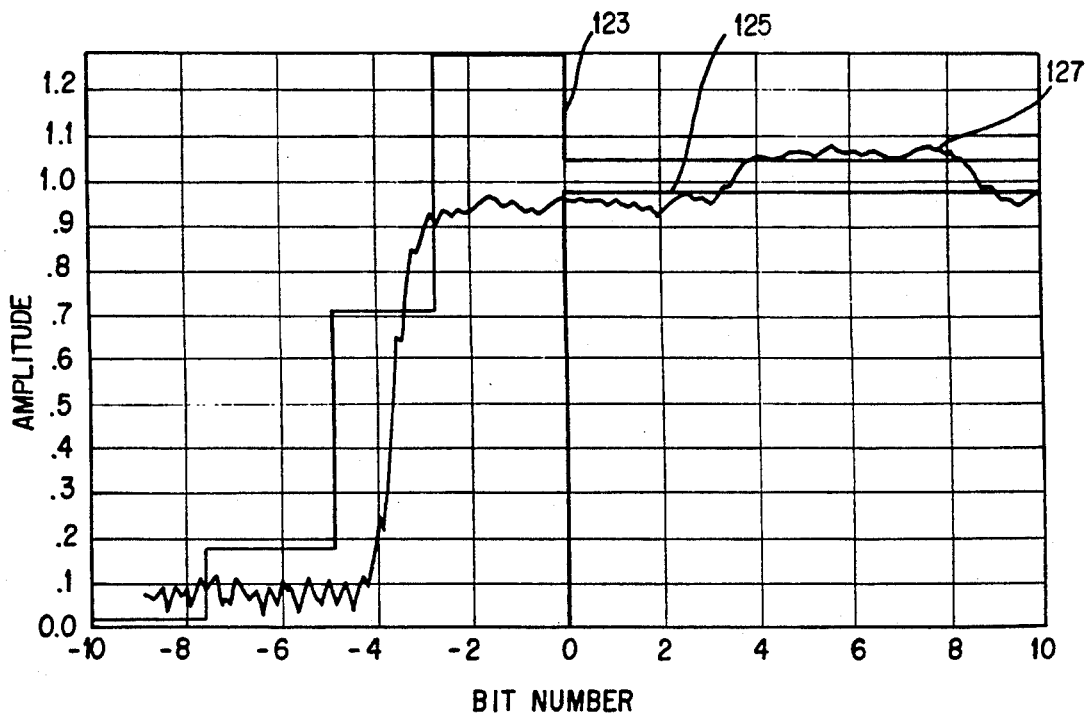
FIG. 13
FIG. 14
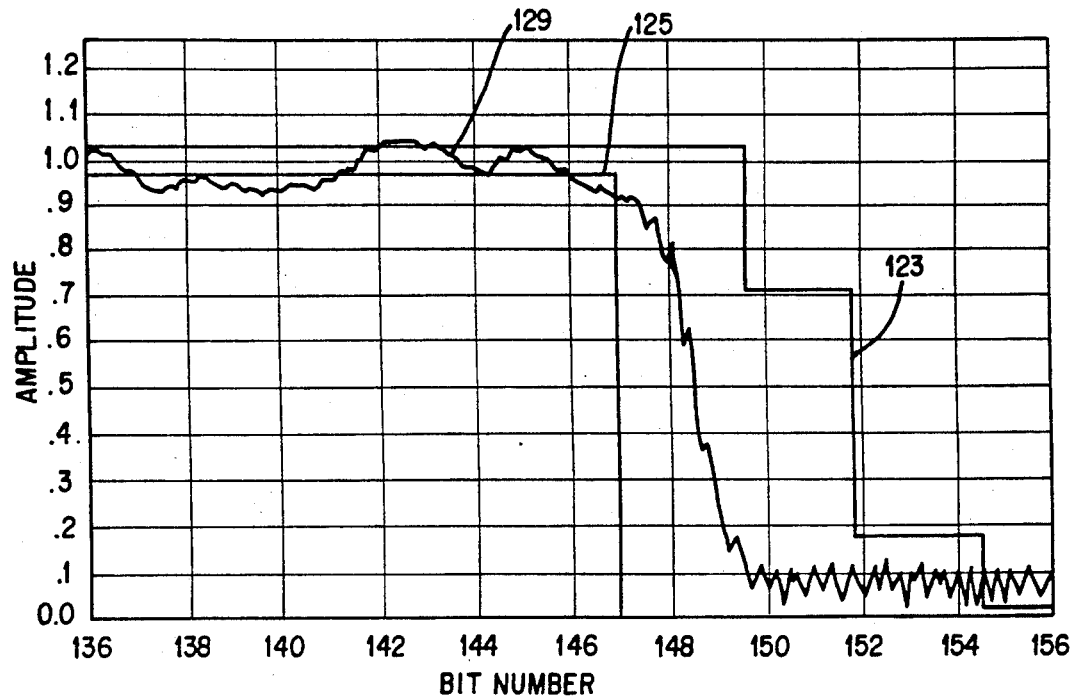

METHOD AND APPARATUS FOR MEASURING MODULATION ACCURACY

RELATED APPLICATION DATA

This application is a continuation in part of copending application Ser. No. 07/297,357, filed Jan. 13, 1989 now U.S. Pat. No. 5,001,724.

FIELD OF THE INVENTION

The present invention relates generally to digital radios and, more specifically relates to a method and apparatus for measuring phase, amplitude and vector errors of continuously modulated signals.

BACKGROUND AND SUMMARY OF THE INVENTION

Presently, a number of manufacturers manufacture and market radios for use in communications, such as digital cellular radios and the like. Typically, each manufacturer provides its own specifications for its products. Traditionally, the accuracy of these specifications has been measured using many separate, possibly indirect methods. Phase accuracy of the transmitted signal, for example, typically is indirectly determined by measuring spurious signals, phase noise, the modulation index, frequency settling speed, carrier frequency and data clock frequency. Further, amplitude measurements present special problems because the amplitude versus time profile must be synchronized to the data typically utilizing external equipment.

It has been proposed that a standardized mobile digital radio system be implemented throughout Europe. Such a radio system would require that all components, such as transmitters and receivers, be manufactured to standard specifications measured by a common method. A group known as the Group Speciale Mobile (GSM) has proposed a measurement technique to measure the accuracy of the modulation process of the transmitted signal. In the proposed measurement technique, a sampled measurement of the transmitted phase trajectory is obtained. This measurement is compared with an accurate estimate of the ideal phase trajectory to determine the phase difference between the transmitted signal and the ideal signal. The slope of the regression line of the phase difference thus determined provides an indication of the frequency error, and the regression line is subtracted from the phase difference to give the phase error. Utilization of a standard method, such as this, would simplify the testing and manufacture of radios. An individual manufacturer would then only need to insure that the standardized overall phase error specifications were met rather than several, interrelated specifications.

$\pi/4$ DQPSK is the modulation standard for the North American Cellular Digital Radio System. The standard was prepared by the Tr 45.3 Subcommittee of Electronic Industries Association/Telecommunications Industries Association (EIA/TIA). Included in the standard are specifications for the modulation accuracy of the transmitter. This standard includes specifications on the average frequency error and the error-vector magnitude of the transmitter. A method and apparatus for producing $\pi/4$ DQPSK modulation is disclosed in copending application Ser. No. 07/529,035 filed May 25, 1990.

SUMMARY OF THE INVENTION

A first embodiment of the present invention provides a method and apparatus for computing an accurate estimate of the ideal phase trajectory of a transmitted signal to be used in the above-described GSM standard phase error measurement method. A transmitted signal is mixed with a local oscillator signal to provide an intermediate frequency (I-F) signal having a relatively low frequency, which is then filtered and sampled by an analog-to-digital convertor (ADC). The digitized samples of the I-F signal are then filtered in a digital low pass filter, such as a linear-phase finite impulse response (FIR) filter, to eliminate the I-F signal harmonics without distorting the phase modulation of the transmitted signal.

The transmitted signal phase trajectory and amplitude profile are calculated from the filtered I-F signal samples. A Hilbert transformer is utilized to create two component signals that are in phase-quadrature with each other. The signal phase trajectory is provided by calculating the arctangent of the quadrature signals, and the amplitude is calculated as the square root of the sum of the squares of the quadrature signals.

The signal phase trajectory is then utilized to detect the data and determine the data clock phase. Detection of the data could be accomplished utilizing a Viterbi decoder or, in the case of a high signal-to-noise ratio (SNR) and low inter-symbol-interference (ISI) signal, by differentiating the phase trajectory. Differentiation of the phase trajectory provides the instantaneous frequency of the signal from which the carrier frequency may be subtracted to provide the frequency deviation of the signal. The instants of time at which the frequency deviation passes through zero are then used in a least squares algorithm to estimate the data clock phase. An accurate estimation of the data clock is critical to the measurement of phase errors.

The zero crossings of the frequency deviation function are also used to detect the data. Synchronization of the data is accomplished utilizing a correlation scheme between the detected data and a known portion of the data sequence, such as a preamble. The synchronization information is then used to find the time interval of interest in the measurement operation. The synchronization information is also used to synchronize the amplitude versus time profile with the data clock.

Utilizing the data clock phase, the detected data sequence and the time interval of interest, a digital signal synthesizer mathematically generates the reference phase trajectory corresponding to the transmitted signal. The reference phase trajectory thus generated is subtracted from the previously measured phase trajectory of the transmitted signal to provide a signal phase difference versus time measurement. A linear regression analysis performed on the phase difference versus time measurement provides an estimate of the frequency error, as well as the instantaneous phase error.

A second embodiment of the invention also provides a method and apparatus for measuring the frequency error and error-vector magnitude with a measurement error very small compared to the error specifications of the transmitter.

The fundamental ideas of both embodiments are identical. Both methods (i) establish an internal reference signal by estimating the parameters of the reference signal from observations of the signal to be measured, (ii) calculate in-phase, quadrature, magnitude and phase signal components as a function of time for both the reference signal and the measured signal, (iii) compare phase and magnitude functions of the reference and measured signals to determine phase and magnitude errors as a function of time.

The second embodiment is different than the first in (i) method of estimating clock delay, (ii) parameters estimated to characterize the reference signal, (iii) method used to estimate these parameters, (iv) performance measures that are calculated and presented to characterize the accuracy of the measured signal, and (v) architecture of the signal processing functions (detailed in the following Appendix).

In the first embodiment, the clock delay (phase) is determined by measuring the zero-crossings of the frequency deviation function and optimally fitting a periodic clock impulse train to these zero-crossings. For low signal-to-noise ratio cases, the estimate of the clock delay is improved by exploiting the nearly linear portions of the phase trajectory.

In the second embodiment, the transmitter signal is down converted to an intermediate frequency and then squared. The squared I-F signal has a discrete spectral line at the clock frequency (symbol rate). The energy in this spectral line is proportional to the amount the transmitter spectrum centered at frequency $f_o$ overlaps with the same spectrum centered at frequency $f_o+f_s$, where $f_s$ is the symbol rate. For the U.S. cellular radio, for which a root raised cosine spectrum with a roll-off factor of $\alpha=0.35$ is proposed, the discrete spectral line will be approximately 15 dB above the self noise of the squared I-F signal and, therefore, will provide a good signal for determining clock delay. The clock delay is estimated by passing the squared I-F signal through a narrowband FIR linear-phase bandpass filter centered at the clock frequency, and calculating the phase of the signal at the filter output. The phase of this output is a linear function of clock delay. A cosine window function is used for this FIR.

In order to improve the estimate of clock delay, the mean-square difference between the measured signal and the reference signal can be used as a performance measure. This performance measure is then minimized with respect to clock delay utilizing a search method. It was found that the performance measure could be reduced by only 0.5 to 1.0 percent by utilizing the search for optimal clock delay. Consequently, this refinement is not discussed.

In the first embodiment, the parameters required to obtain the reference signal are (i) clock delay, (ii) data sequence, (iii) carrier frequency, (iv) carrier phase and (v) amplitude scale factor. In the second embodiment, two additional parameters are used: (vi) amplitude droop factor and (vii) I/Q offset.

The amplitude droop factor is the amount in nepers per unit time in which the pulse amplitude decays.

The I/Q offset is the amount by which the origin of the reference plane for the baseband in-phase and quadrature components of the transmitter signal are offset from zero. The in-phase and quadrature components of this offset are given as $I_o$ and $Q_o$, respectively.

The seven parameters listed above are estimated by finding their values that minimize the performance measure. In the first embodiment, the performance measure is the RMS phase error averaged over an entire burst. In the second embodiment, the performance measure is the RMS vector-error magnitude averaged over the decision points of a burst.

In the first embodiment, the accuracy of the measured signal is characterized by the root-mean-square (RMS) difference and peak difference of the phase between the measured and reference signals, and the peak deviation of the signal magnitude from a specified envelope, over the duration of a signal burst.

In the second embodiment, the RMS vector-error magnitude averaged over points in time is utilized to characterize the accuracy of the measured signal. The vector-error is the phasor difference as a function of time between the measured and reference signals. In this second embodiment, the RMS error-vector magnitude is determined over any single burst and also for the first 10 symbols of 10 bursts captured within a one minute interval. The corresponding RMS magnitude and phase errors are determined.

The foregoing and additional features and advantages of the invention will be more readily apparent from the following detailed description, which proceeds with reference to the accompanying drawings.

BRIEF DESCRIPTION OF THE DRAWINGS

FIG. 13 is a plot showing an expanded view of the rise time of the pulse shown in FIG. 12.

FIG. 14 is a plot showing an expanded view of the fall time of the pulse shown in FIG. 12.

DETAILED DESCRIPTION OF THE PREFERRED EMBODIMENTS

Figure 1:
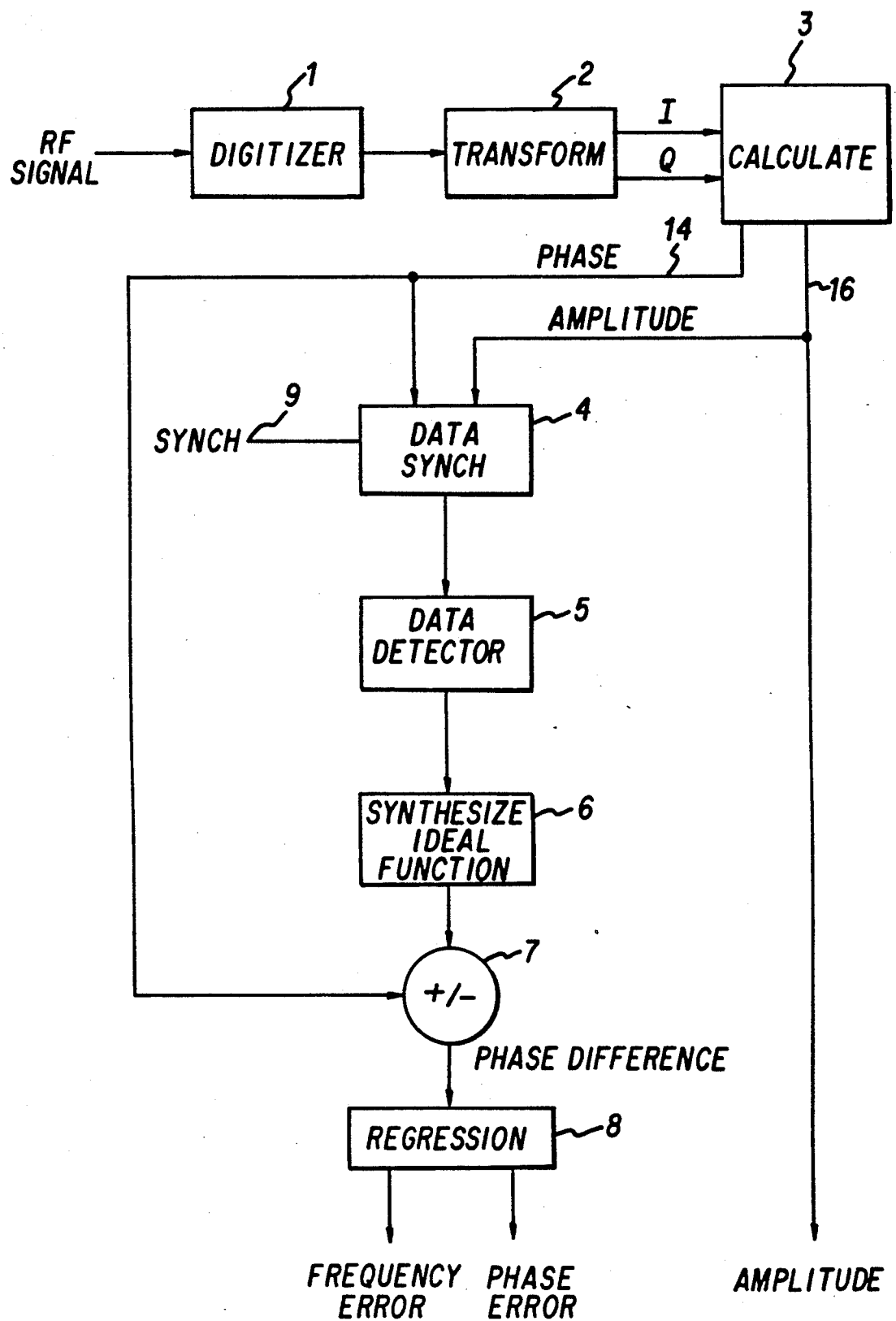
FIG. 1 is a flow chart illustrating a method for measuring the phase error of a transmitted signal according to a first embodiment of the present invention.
Figure 4:
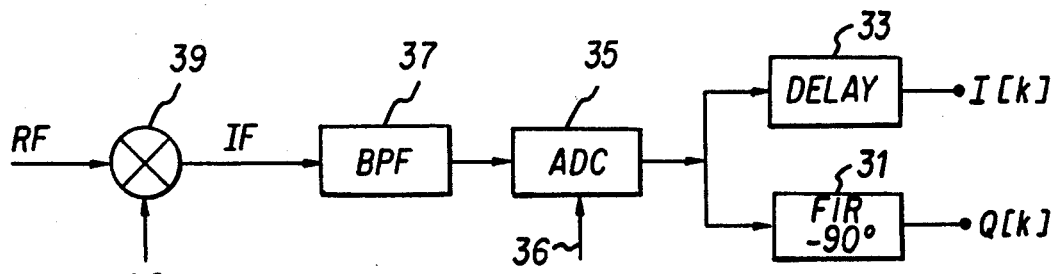
FIGS. 4, 5 and 6 are functional block diagrams illustrating three different techniques for converting an I-F signal to in-phase and quadrature-phase signals.
Figure 5:
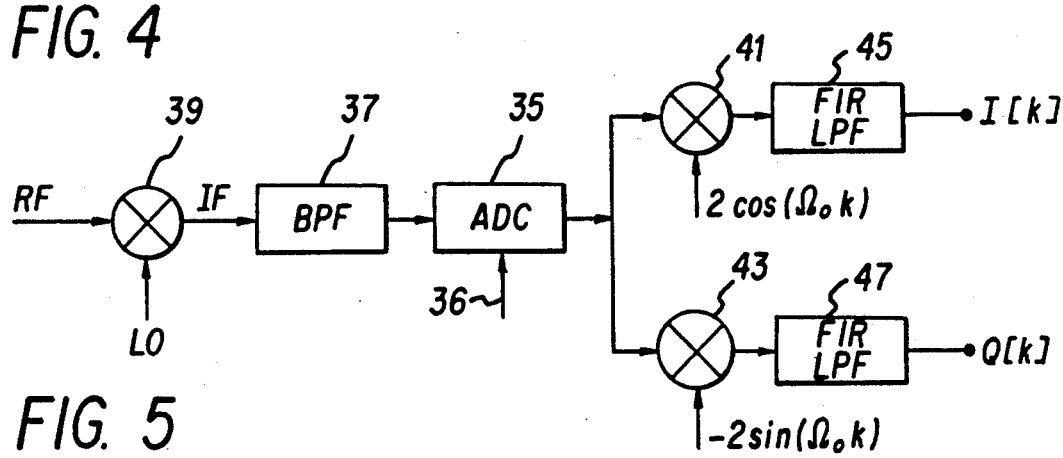
Figure 6:
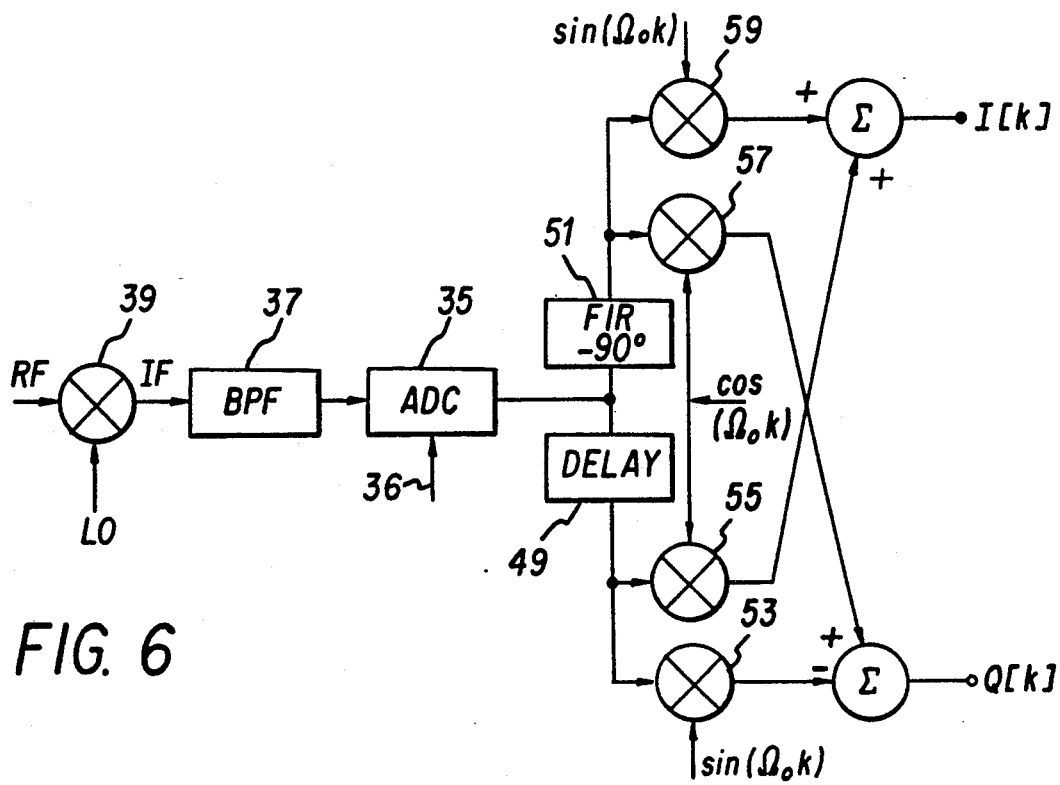
Figure 10:
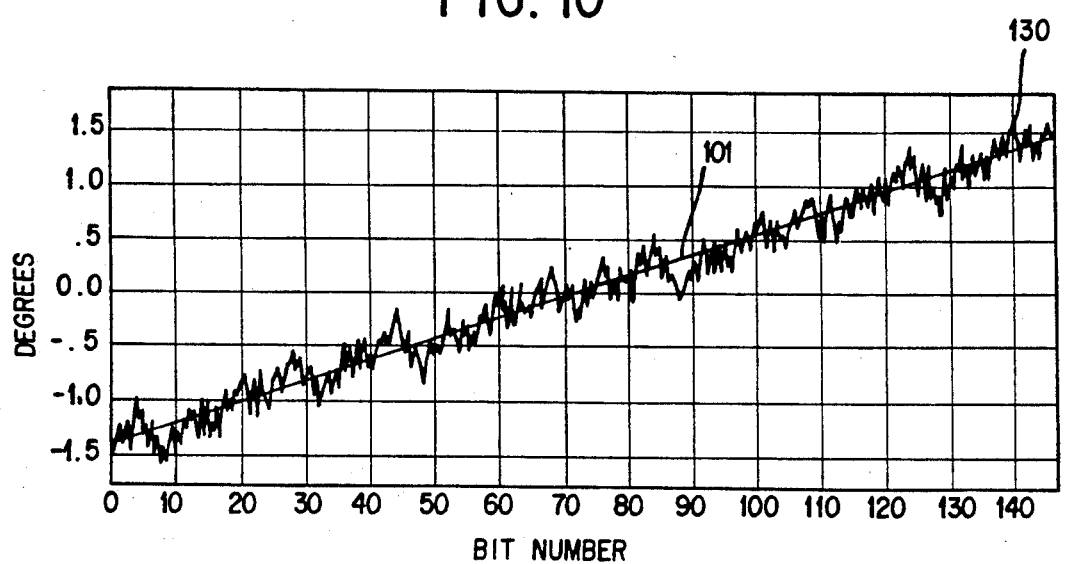
FIG. 10 is a plot showing the instantaneous phase difference and linear regression curve.

Referring now to FIG. 1, a flow chart illustrating a first preferred embodiment of a method for measuring the phase error of a continuous-phase-modulated RF signal is shown. A modulated RF signal generated by a transmitter is received and converted to digital form by a digitizer circuit 1. The digitized signal is then converted or transformed into its component in-phase and quadrature-phase signals by a transformation circuit (such as shown in FIGS. 4, 5 and 6) and the transmitted signal amplitude and phase functions are computed by a calculator 3 from the component signals. Utilizing a known synchronization signal 9, for example a known sequence of data bits (i.e. a preamble or midamble), the bit sequence representing the transmitted data is synchronized (block 4) from the phase and amplitude functions to provide the transmitter data clock and a test data interval. A data detector 5 detects the data bit sequence and provides three signals (transmitter data clock, test data interval and the data bit sequence) to a synthesizer block 7 to synthesize or mathematically calculate a reference phase function corresponding to the ideal transmitted signal. The data detector 5 may be implemented as a maximum likelihood sequence estimator utilizing the Viterbi algorithm. The measured phase function (i.e., the transmitted signal phase) is subtracted from the reference phase function thus synthesized in block 7 to provide a phase difference. A linear regression of the phase difference (block 8) then provides the frequency error, the slope of the regression line 101, and the phase error, curve 103 (as shown in FIG. 10).

Figure 2:
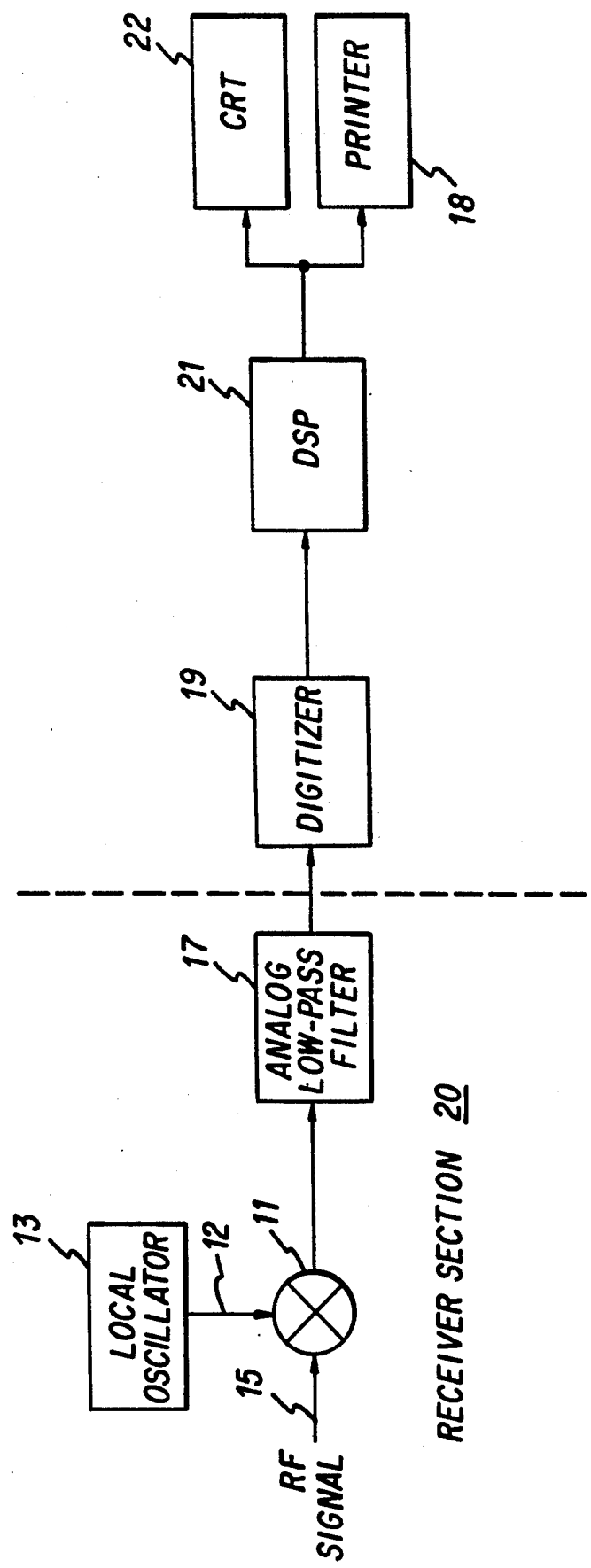
FIG. 2 is a conceptual block diagram of an apparatus for measuring the phase error of a transmitted signal according to the method shown in FIG. 1.

Referring now to FIG. 2, a conceptual block diagram of an apparatus for measuring the phase error and phase amplitude of a continuous-phase-modulated RF signal is shown. The modulated RF signal is received by a receiver 20 and coupled to a down conversion mixer circuit 11. This mixer circuit receives a local oscillator signal on line 12 generated by the local oscillator 13 and a test signal on line 15 to provide an intermediate frequency (I-F) signal having a substantially lower frequency than that of the test signal. In the preferred embodiment the I-F frequency is 700 KHz. The I-F signal is filtered in an analog anti-aliasing filter 17 to remove local oscillator and RF signal feed through and spurious signals. The filtered I-F signal is coupled to a digitizer 19 to convert the analog I-F signal to a discrete-time data sequence at a high sample rate, preferable at 2.8 million samples per second (Msps). An HP70700A digitizer manufactured by Hewlett-Packard Company may be used for this purpose, or the digitizer 19 may be implemented by an ADC sampling at a higher rate, as shown in FIGS. 4, 5 and 6. After conversion to an I-F signal, having a frequency of approximately 700 KHz, the test signal can be represented as $$y(t) = \tilde{A}(t)\cos[(\omega_o + \Delta\omega)t + \tilde{\phi}(t;\underline{a}) + \phi_o] \quad (1)$$

where:
$\tilde{A}(t)$ is the received signal amplitude;
$\omega_o = 2\pi(700 \text{ KHz})$ and is the nominal I-F signal frequency;
$\Delta\omega$ is the frequency certainty;
$\tilde{\phi}(t;\underline{a})$ is the received signal phase modulation function; and $\phi_o$ is an unknown offset phase.
As given here only $\tilde{\phi}(t;\underline{a})$ is a function of the data sequence $\underline{a}$. However, in general $\tilde{A}(t)$ may also be a function of $\underline{a}$.

A transmitted RF signal or the I-F signal down converted from the RF transmitted signal defined by equation (1) typically will be received in bursts having a duty cycle of 0.125 and being approximately 0.5 milliseconds (ms) in duration.

$\tilde{A}(t)$ and $\tilde{\phi}(t;\underline{a})$ are, respectively, the amplitude modulation and phase modulation of the received signal (i.e., the transmitted signal) which will be different than the ideal modulation of the transmitted signal. The present method determines the difference between the values of the received signal functions $\tilde{A}(t)$ and $\tilde{\phi}(t;\underline{a})$ and the accurate estimate of the idea values of these functions.

The digitizer 19 converts the I-F signal defined by equation (1) to a sequence of discrete time samples. If the sampling points are given as $t = kT_s$, $k = 0, 1, 2, \ldots$ where T is the time period between samples, and if we define $\Omega_o = \omega_o T_s$ and $\Delta\Omega = \Delta\omega T_s$, then the sequence of samples can be written as $$y[k] = \tilde{A}[k]\cos[(\Omega_o + \Delta\Omega)k + \tilde{\phi}(k;\underline{a}) + \phi_o] \quad (2)$$

$K = 0, 1, 2, \ldots$

Quantized values of equation (2) provide the sequence of binary numbers coupled to the digital signal processor 21 for implementation of the present method.

Figure 11:
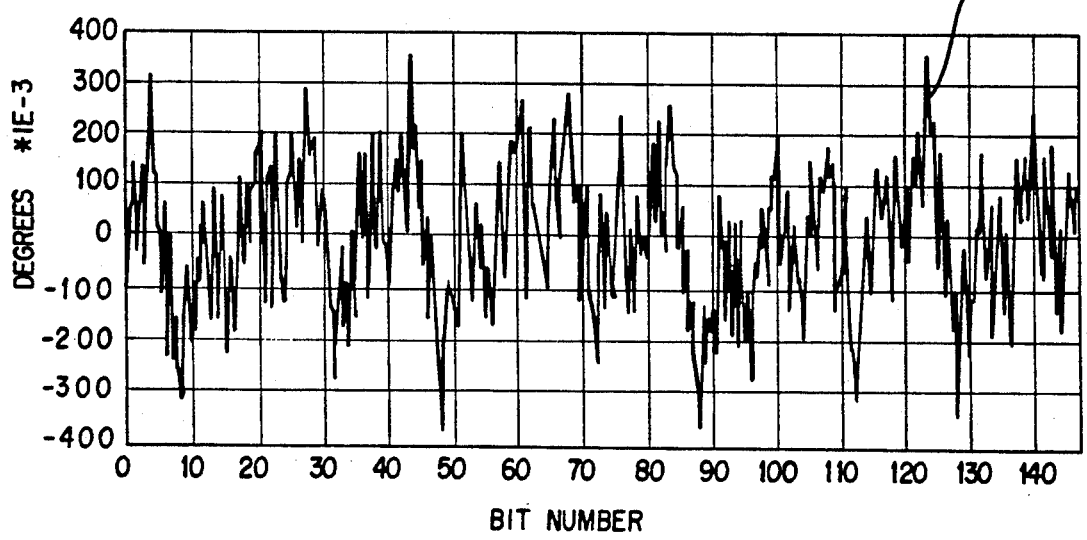
FIG. 11 is a plot showing instantaneous measured phase error versus bit number.
Figure 12:
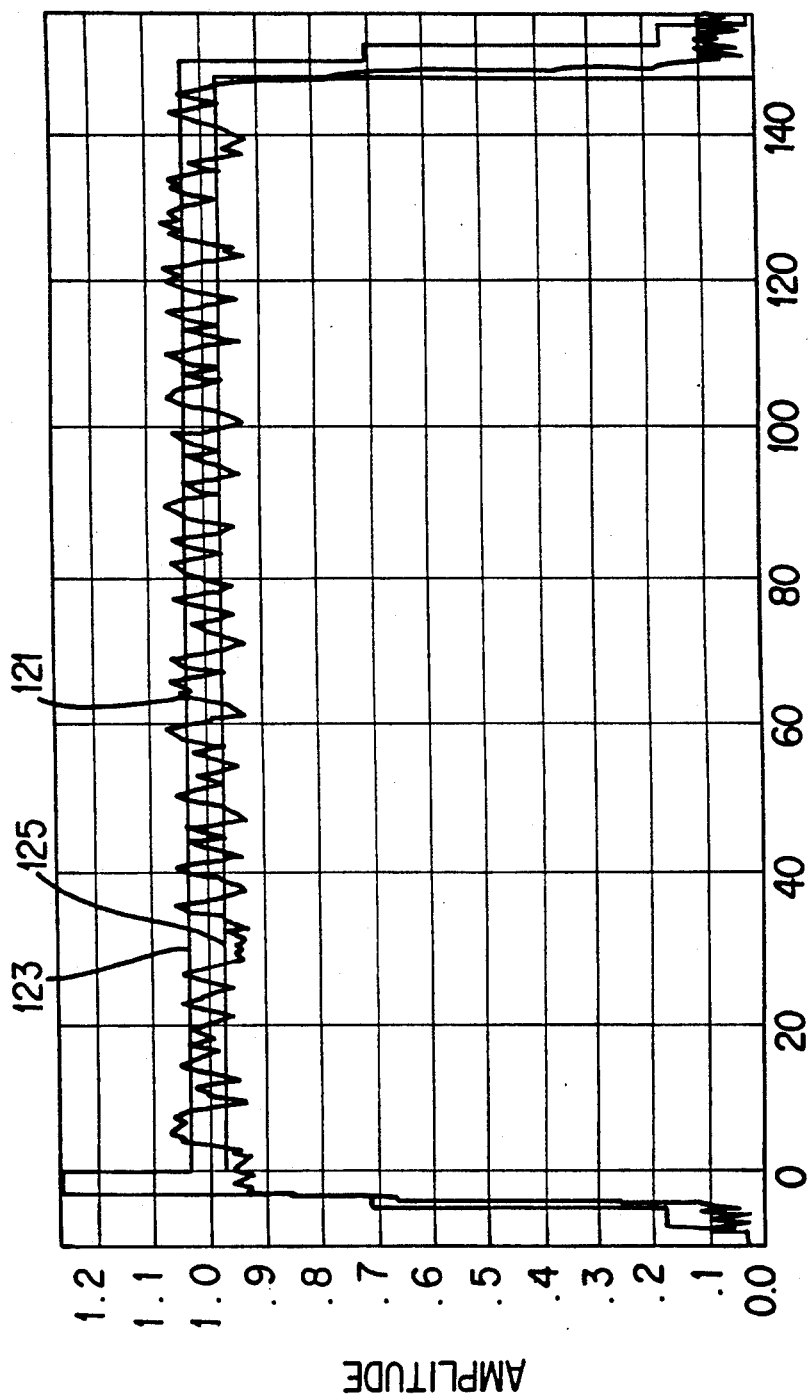
FIG. 12 is a plot showing measured pulse amplitude.

The outputs of the digital signal processor 21, phase error, frequency error and the amplitude profile are coupled to various display means, such as a cathode ray tube (CRT) 22 and a printer 18. The display means include the required circuitry to format the display of the information provided by the digital signal processor 21. Typically, the phase, frequency and amplitude information are plotted versus time with the time interval defined by the number of data bits contained in a transmitted signal burst. FIGS. 10 and 11 are examples of phase difference and frequency error and phase error plots, while FIGS. 12, 13 and 14 are plots of the transmitted signal amplitude profile.

Figure 3:
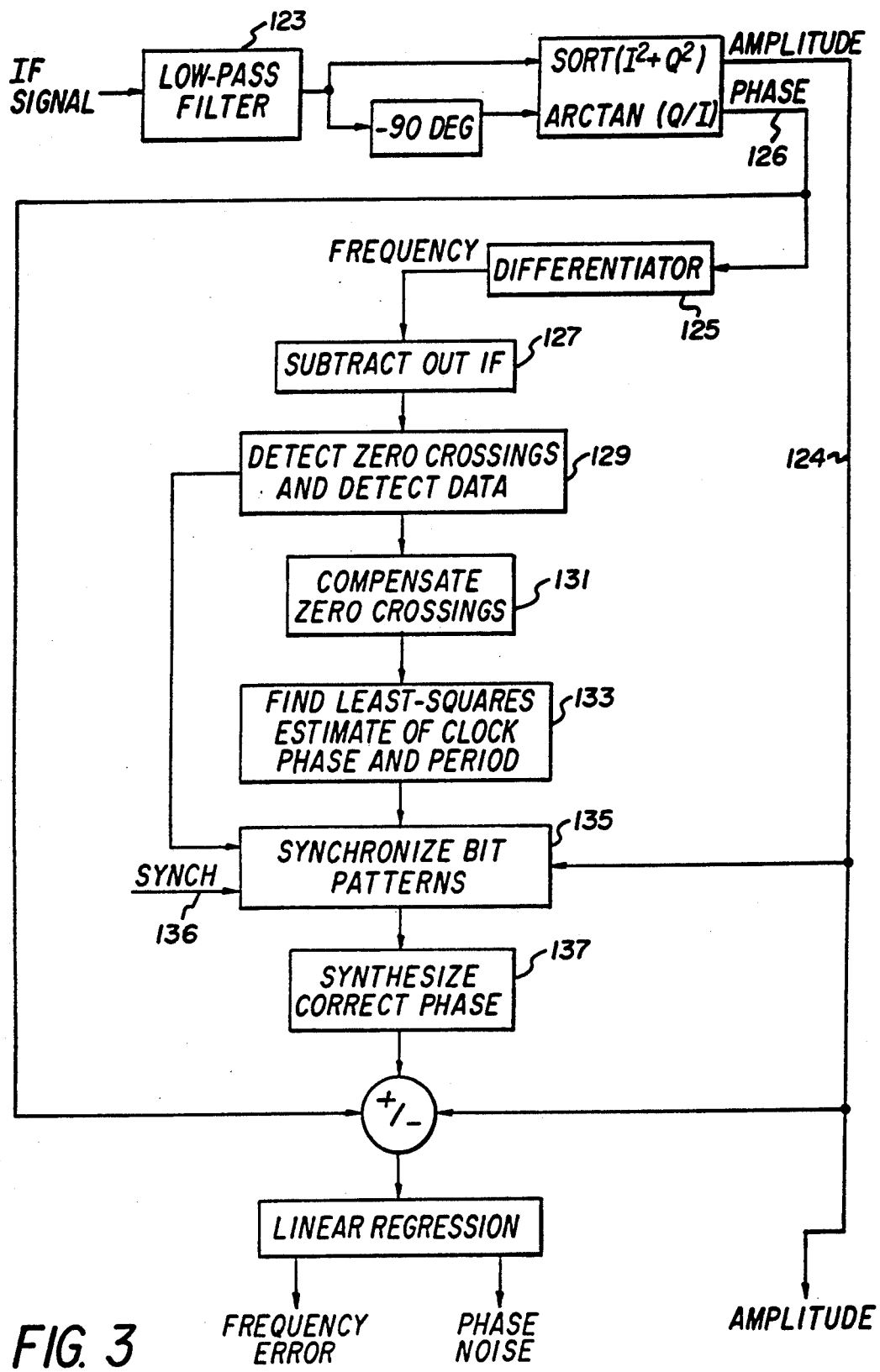
FIG. 3 is a flow chart of a method for measuring the received amplitude and the phase error of a transmitted signal according to the principles of the present invention.

FIG. 3 is a flow chart illustrating a variation of the first embodiment for determining the received RF signal amplitude, $\tilde{A}[k]$, and the difference between the measured phase modulation, $\tilde{\phi}(k;\underline{a})$, of the received RF signal and the estimate of the ideal phase modulation, $\phi(k;\underline{a})$. The modulation functions have been discretized by replacing "t" with $kT_s$, $k = 0, 1, 2, \ldots$ The first step in the flow diagram is to pass the digital I-F samples through a low-pass digital filter 123. The low-pass digital filter 123 would preferably be a finite impulse response (FIR) filter that would have a linear phase response to avoid distortion of the phase modulation of the signal passed by the filter 123. The purpose of the low-pass filter 123 is to eliminate the harmonics of the 700 KHz I-F signal. A FIR digital filter can perform this job with relative ease and with less cost than an analog filter which otherwise would be required.

After the initial low-pass filtering, the signal is converted to two component signals that are in-phase quadrature with each other. Three different techniques are proposed as possible methods for producing the quadrature signals.

Referring to FIG. 4, a first method of conversion to in-phase, I[k], and quadrature-phase, Q[k], (I-Q conversion) signals utilizes a Hilbert transformer 31. A RF signal is down converted to an I-F signal by mixing with a local oscillator signal in mixer 39. The resulting I-F signal is coupled to an ADC 35 via band pass filter 37. The filtered I-F signal is converted to a digital signal by a high-sampling rate ADC 35 which is clocked by the sample signal on line 36. The Hilbert transformer 31 comprises a filter with a constant magnitude response and phase response of −90 degrees for positive frequencies and +90 degrees for negative frequencies. An approximation to the Hilbert transformer 31 can be realized with an odd-symmetric FIR filter 31 that has an ideal phase response and an amplitude response that is nearly ideal over the range of frequencies of the signal. Delay line 33 compensates the in-phase signal for time delays introduced into the quadrature-signal by the FIR filter 31.

Referring now to FIG. 5, a second method I-Q signal decomposition involves mixing the digitized I-F signal with quadrature signals at mixers 41 and 43 and passing the low-frequency components through low-pass filters 45 and 47, respectfully. If the signal given by equation (2) is multiplied by $2\cos(\Omega_o k)$ and $-2\sin(\Omega_o k)$, and the double frequency terms rejected by low--pass filtering, then the outputs of the low-pass filters are $$I[k] = \bar{A}[k]\cos[\Delta\Omega k + \bar{\phi}(k;\underline{a}) + \phi_1]$$

and (3)

$$Q[k] = \bar{A}[k]\sin[\Delta\Omega k + \bar{\phi}(k;\underline{a}) + \phi_1]; \ k=0, 1, 2, \ldots$$

Equations (3) represent the desired I-Q signals.

The digital implementation of the I-Q mixing method illustrated in FIG. 5 has a significant advantage over a corresponding analog implementation in terms of the precise quadrature-phase and amplitude balance that can be maintained. Precise balance of the quadrature signals is a critical requirement for this method.

Referring finally to FIG. 6, a third method of I-Q signal decomposition involves the utilization of a Hilbert transformer 51, delay line 49 and four mixers 53, 55, 57 and 59. This configuration approximates two single-sideband mixers that are in phase-quadrature. The advantage of this method over that shown in FIG. 5 is the elimination of the low-pass filters 45 and 47 which are not required because the double frequency terms are cancelled by the single-sideband mixers.

All three techniques described above will allow decimation of the I[k] and Q[k] samples by a factor of four or more to allow efficient processing of I[k] and Q[k]. An advantage of the low-pass filtering shown in FIG. 5 is a reduction in ADC quantization noise introduced by the digitizer 19.

After I[k] and Q[k] are produced, amplitude and phase functions are computed and output on lines 124 and 126, respectively. The amplitude function is given as $$A[k] = SQRT[I^2[k] + Q^2[k]]$$

$$k = 0, 1, 2, \ldots, K \quad (4)$$

and the phase function is given as $$\theta[k] = ARCTAN\{-Q[k]/I[k]\} \quad (5)$$

$$k = 0, 2, 1, \ldots, K$$

K + 1 is the number of samples in a burst, for example, if the duration of a burst is 0.5 milliseconds and the sampling rate is 2800 Ksps, then K = 1400.

The phase samples given by equation (5) are passed through a differentiator to produce samples of the frequency versus time function. The differentiator 125 is preferably an odd-symmetric FIR digital filter that has a linear magnitude response and a 90 degrees phase shift over the range of frequencies of the test signal. Like the Hilbert transformer 51 the differentiator 125 is a well-known digital filter that is easily and accurately implemented in digital hardware.

Figure 7:
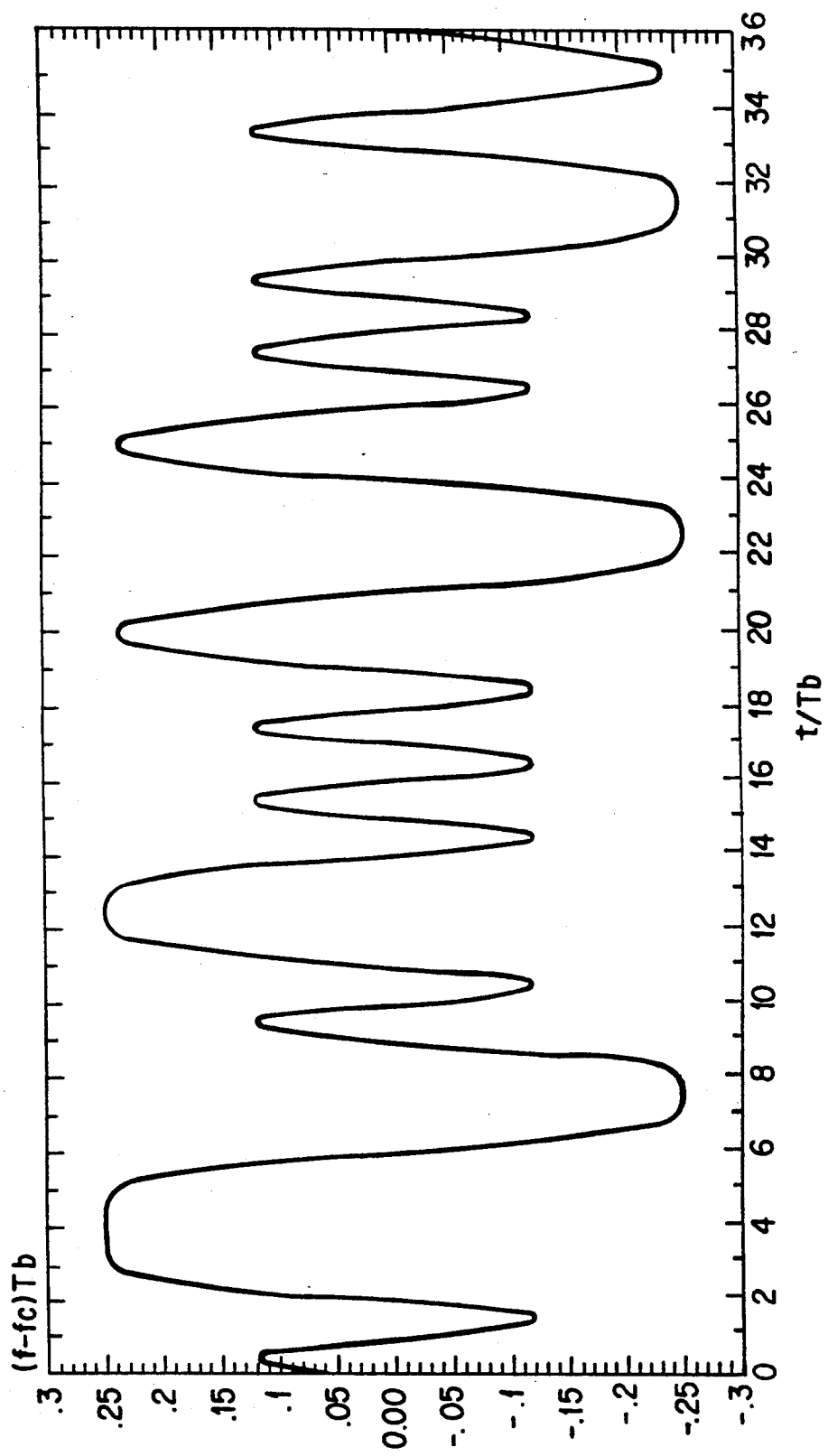
FIG. 7 is a frequency plot illustrating a typical frequency deviation function for an GMSK.3 modulated signal.
Figure 8:
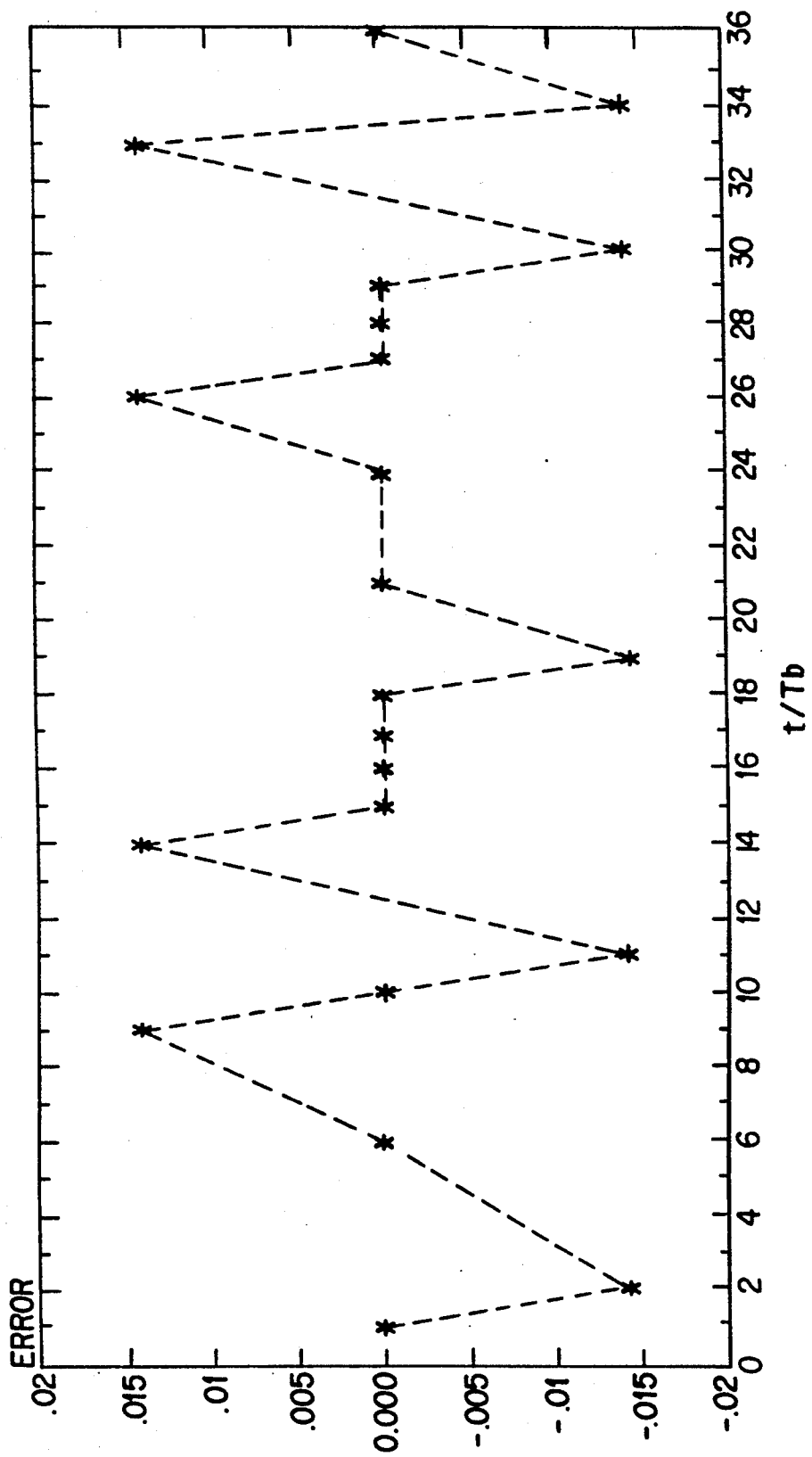
FIG. 8 is a plot illustrating the error in the detected zero crossings of the frequency deviation plot shown in FIG. 7.

Referring now also to FIGS. 7 and 8, a typical frequency deviation function for GMSK.3 modulation (a modulation scheme proposed in Europe for digital mobile radios) is shown. In FIG. 7, $(f-f_c)T_b$ is the frequency deviation from the signal carrier (I-F) frequency, $f_c$, normalized by the bit rate $f_b = 1/T_b$, where $T_b$ is the bit interval. The frequency deviation is shown for 36 bits in FIG. 7. A positive value of frequency deviation over a bit interval represents one binary state and a negative value the other binary state. The frequency function shown in FIG. 7 represents the bit sequence 101111000101110101011000110101000100 (6)

or the complement of this sequence.

From FIG. 7, it can be seen that the frequency deviation passes through zero approximately at multiples of $T_b$, as shown in FIG. 8. From FIGS. 7 and 8, it can be seen that if the bit pattern is known, then deviations in the zero-crossings from multiples of $T_b$ are predictable. For example, if bit 10 is followed by bit 11, then the zero-crossing between bit 10 and bit 11 will deviate from a multiple of $T_s$ by $-0.0142T_b$. The error in the zero-crossing between bit 00 and bit 10 will be $0.0142T_b$ and the zero-crossing between bit 11 and bit 00 will be approximately at a multiple of $T_s$, etc.

The output of the differentiator 125 is not a continuous time function, as shown in FIG. 7, but is comprised of actual samples (values) of the frequency function. For example, if the bit rate is 270 kbps and the sampling rate is 2.8 Msps, then there would be 10.37 samples per bit.

Referring again to FIG. 3, following the differentiator 125, the I-F frequency is subtracted (block 127) from frequency function to produce the frequency deviation function, as presented in FIG. 7. The next step, block 129, is to detect the zero-crossing from which the receive data sequence is detected, as illustrated by bit sequence (6). Since discrete time samples of frequency deviation are available, the zero-crossings are detected using an interpolation algorithm. From the detected data sequence, a correction is made, block 131, to compensate for the difference in zero-crossings from multiples of $T_b$. These compensated zero-crossings provide the data used to establish a data clock synchronized to the transmitter (not shown) data clock.

In block 133, the period and phase of the transmitter data clock must be estimated very accurately to minimize errors in the measured phase error. For example, an error of 1 per cent in the data clock phase will result in a phase measurement error as large as 0.9 degrees, which may not be acceptable. Even though measured zero-crossings are compensated, measurement noise may result in an unreliable data clock unless the data clock is estimated in an optimal manner. The transmitter data clock may be represented as $$t_k = kT + b, \ k = 0, 1, 2, \ldots \quad (7)$$

where T is the transmitter data clock period and b is the unknown data clock phase. The a priori clock period $\hat{T}$ is known within a specified tolerance of T. The objective is to obtain estimates $\hat{T}$ and $\hat{b}$ of T and b from the measured zero-crossings.

Suppose $s_i$, $i = 1, 2, \ldots, N$ are the measured and compensated zero-crossings of the frequency deviation function. An estimate of the zero-crossings spaced by multiples of $\hat{T}$ can be written as $$\hat{s}_i = k_i \hat{T} + \hat{b} \tag{8}$$

where $$k_i = INT[(s_i - \epsilon_1)/\hat{T} + 0.5] \tag{9}$$

and $\epsilon_1$ is a time reference which may be a zero-crossing near the center of the signal burst. Values of $\hat{T}$ and $\hat{b}$ are obtained such that the mean-square difference between the sets $s_i$ and $\hat{s}_i$, $i = 1, 2, \ldots, N$ given by $$\overline{\epsilon^2} = \frac{1}{N} \sum_{i=1}^{N} (s_i - k_i \hat{T} - \hat{b})^2 \tag{10}$$

is minimized. The resulting estimates are $$\hat{T} = \frac{\sum_{i=1}^{N} k_i s_i - \frac{1}{N}\left(\sum_{i=1}^{N} s_i\right)\left(\sum_{i=1}^{N} k_i\right)}{\sum_{i=1}^{N} k_i^2 - \frac{1}{N}\left(\sum_{i=1}^{N} k_i\right)^2} \tag{11}$$

and $$\hat{b} = \frac{1}{N}\left[\sum_{i=1}^{N} s_i - \hat{T} \sum_{i=1}^{N} k_i\right] \tag{12}$$

The receiver data clock synchronized to the transmitter data clock is given as $$t_k = k\hat{T} + \hat{b}; \quad k = 0, 1, 2, \ldots \tag{13}$$

If the clock period T is known a priori with sufficient accuracy for the required measurement, or if it is required that the measurement include the measurement of phase errors attributable to inaccuracies in T, T would not be estimated. In this case, $\hat{T} = T$ in equations (12) and (13) and only the data clock phase is estimated, as given by equation (12).

The next step, block 135, is to synchronize bit patterns to establish the active time interval of a signal burst over which the phase and amplitude errors are determined and displayed. If a synchronizing pattern, such as a preamble or midamble is available, i.e., included in the transmitted signal burst, then the leading and trailing edges of the envelope of the burst obtained from $\overline{A}[k]$ as given by equation (4) are used to establish the range over which the preamble or midamble may exist. A discrete-time cross-correlation of the detected bit pattern with the known synchronizing pattern is performed to align the two patterns and establish the active interval. If a synchronizing pattern does not exist, then the active interval of the test is centered between the leading and trailing edges of the envelope of the burst.

Knowledge of the clock phase and period, the data sequence, and the time interval of interest provide the information needed to mathematically compute the ideal amplitude and phase modulating functions $A[k]$ and $\phi[k; \underline{a}]$. These computed functions are then compared at block 38 with the corresponding measured values of amplitude and phase to obtain measurements of amplitude and phase errors.

By way of example, synthesis block 137, of the phase function for continuous-phase-modulated signals (CPM) will be considered here.

The phase function for CPM can be written as $$\phi(t; \underline{a}) = 2\pi \sum_{i=-\infty}^{\infty} h_i a_i q(t - iT_b) \tag{14}$$

where $$\underline{a} = (\ldots, a_{-1}, a_0, a_1, a_2, \ldots)$$

with $a_1 = \pm 1, \pm 3, \ldots, \pm(2M-1)$ is the data sequence. For binary modulation, $M = 1$ and $a_1 = \pm 1$.

Figure 9A:
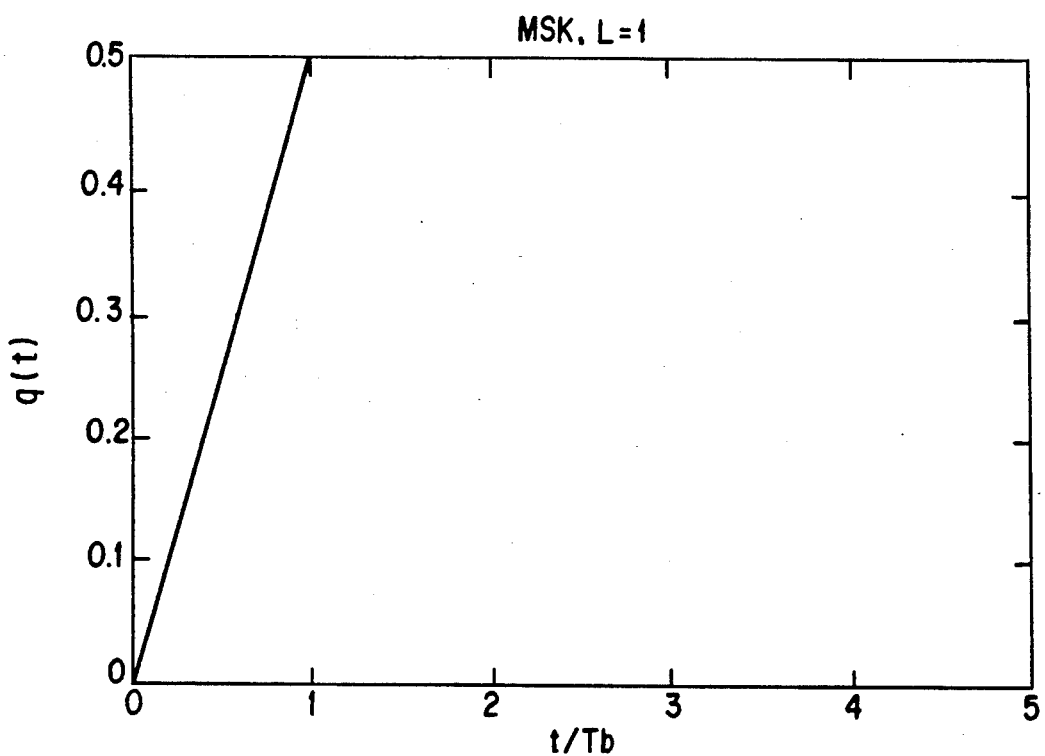
FIG. 9a is a plot showing the phase pulse response for minimum shift-key modulation.
Figure 9B:
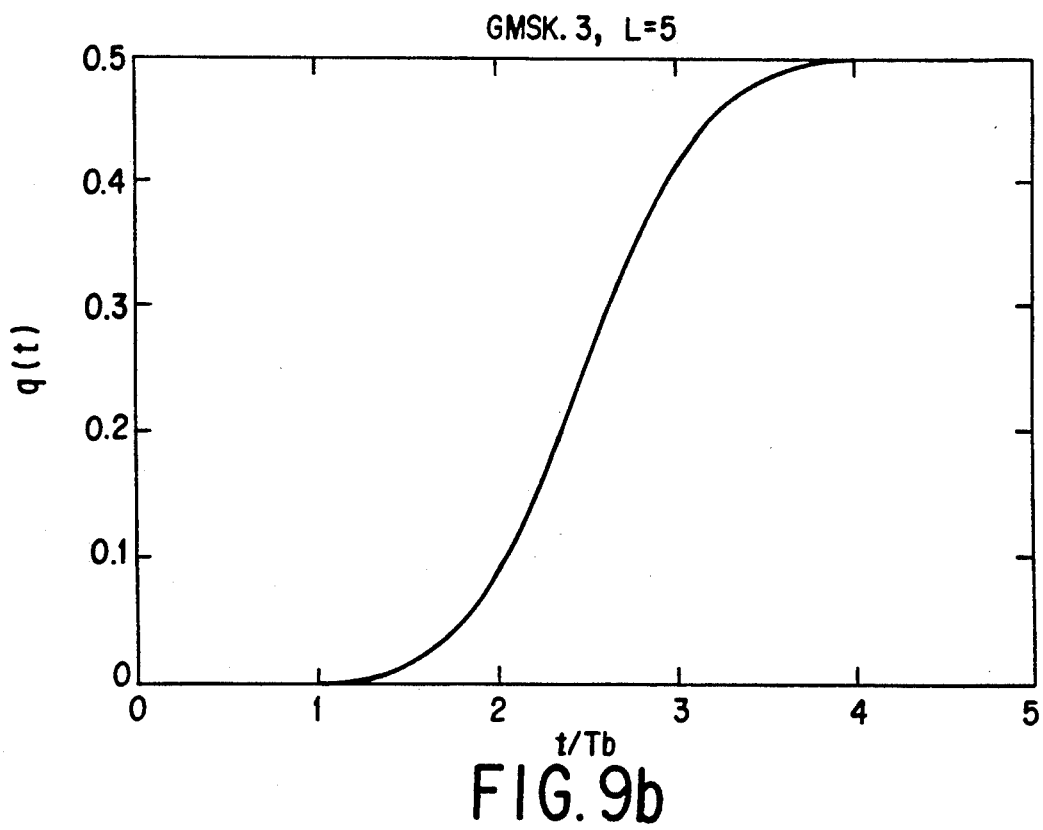
FIG. 9b is a plot showing the phase pulse response for Gaussian minimum shift-key modulation.

$h_i$ is the modulation index which in general may be a cyclic function of time. For many common modulations, such as minimum shift-key (MSK) and Gaussian minimum shift-key (GMSK), $h = \frac{1}{2}$ (constant). $q(t)$ is the phase pulse-shape function which has the property that $$\begin{aligned} q(t) &= 0, \, t < 0 \\ &= \tfrac{1}{2}, \, t > LT_b \end{aligned} \tag{15}$$

where L is a positive integer. The type of modulation is determined by $q(t)$. Phase pulse response curves for MSK and GMSK.3, $L = 5$, are plotted in FIGS. 9a and 9b, respectively.

After the reference phase function $\phi[k; \underline{a}]$ is synthesized, it is subtracted from the measurement phase function $$\Theta[k] = \Delta\Omega k + \overline{\phi}[k; \underline{a}] + \phi_1 \tag{16}$$

to produce the difference given as $$\begin{aligned} \Theta_\phi[k] &= \Theta[k] - \phi[k; \underline{a}] \\ &= \Delta\Omega k + \overline{\phi}[k; \underline{a}] - \phi[k; \underline{a}] + \phi_1 \end{aligned} \tag{17}$$

The phase error is defined as $$\epsilon_\phi[k] = \overline{\phi}[k; \underline{a}] - \phi[k; \underline{a}] \tag{18}$$

i.e., the difference between the received and synthesized reference phase functions, so that the phase difference is $$\Theta_\phi[k] = \Delta\Omega k + \epsilon_\phi[k] + \phi_1 \tag{19}$$

$$k = 1, 2, \ldots, K$$

where $\Delta\Omega$ is the frequency error and $\phi_1$ is the unknown offset phase.

The phase difference, $\Theta_\phi[k]$, has a linear term $\Delta\Omega k$ with slope $\Delta\Omega$ and a constant term $\phi_1$, that can be estimated by fitting the K values given by equation (19) to a linear regression curve $$\hat{\Theta}_\phi[k] = \Delta\hat{\Omega} k + \hat{\phi}_1 \tag{20}$$

The difference between equations (19) and (20) given as $$\hat{\epsilon}_\phi[k] = \epsilon_\phi[k] + (\Delta\Omega - \Delta\hat{\Omega})k + (\phi_1 - \hat{\phi}_1) \quad (21)$$

$$k = 1, 2, \ldots, K$$

along with statistics of $\hat{\epsilon}_\phi[k]$ is the desired output of the method.

Referring now also to FIGS. 10, 11, 12, 13 and 14, the phase error and other information determined by the above-described method is plotted. In FIG. 10, the measured phase difference on a bit-by-bit basis is plotted versus time as curve 103. Curve 103 shows the difference in phase between the reference phase function and the transmitted phase function for each data bit in a signal burst. Curve 101 is the linear regression of the phase difference plotted versus the data bit number for a data burst. The slope of the linear regression curve 101 represents the frequency error of the transmitted signal. In FIG. 11, curve 111 is a plot of the instantaneous phase error versus time (but number) for the data bits in a signal burst and represents the instantaneous phase error of the transmitted signal when compared to the reference signal. FIGS. 12, 13 and 14 are a plot of the measured signal amplitude versus bit number for a signal burst. Curve 121 is the amplitude of the signal burst. Curves 123 and 125 are the upper and lower bounds allowed for the amplitude. Curve 127 is an expanded plot of the rise time of the transmitted signal amplitude and curve 129 is an expanded plot of the fall time of the transmitted amplitude.

Second Embodiment

Figure 15:
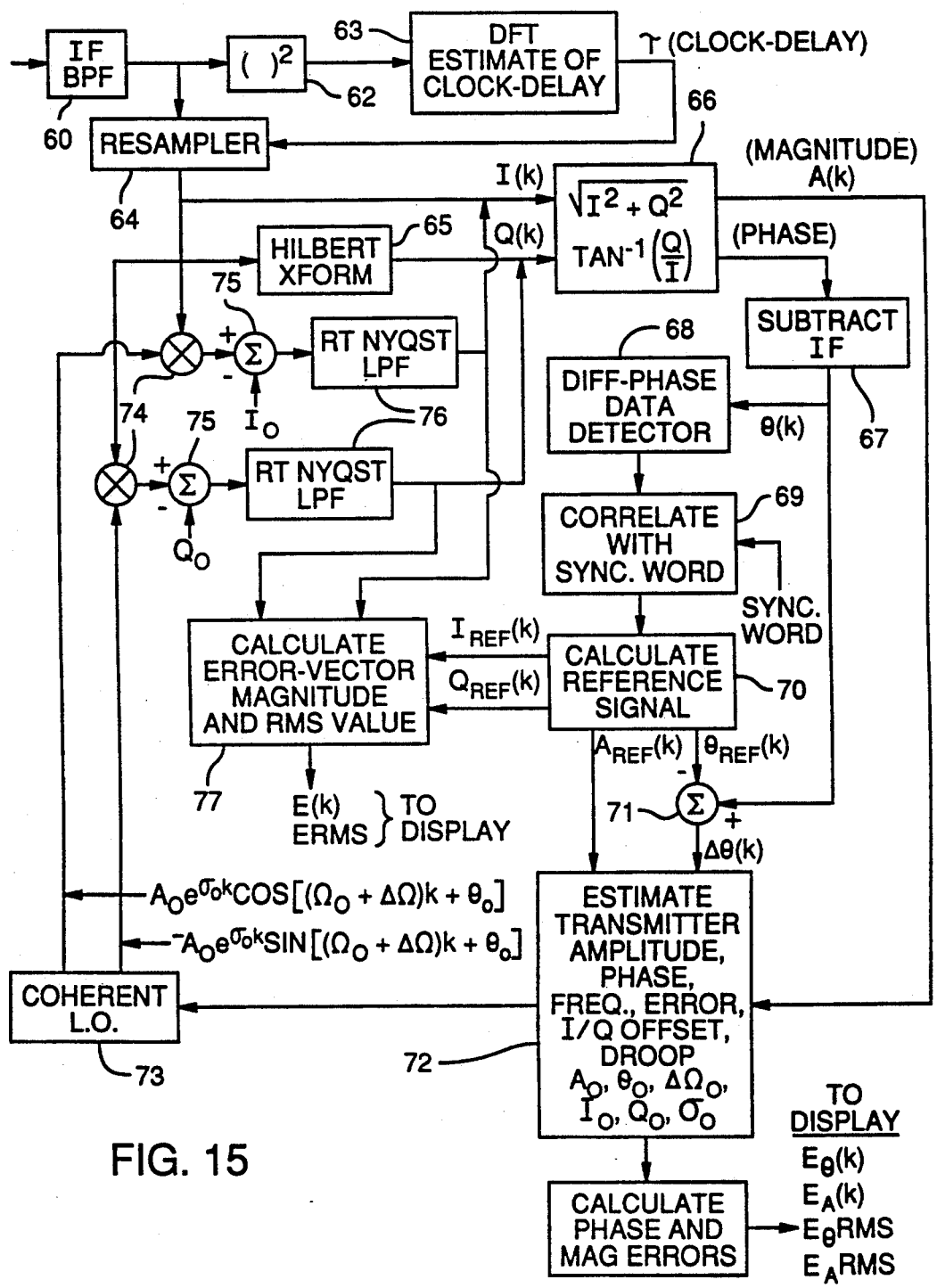
FIG. 15 is a flow diagram illustrating a system according to a second embodiment of the present invention for measuring the modulation accuracy of a $\pi/4$ DQPSK I-F signal.

Referring to FIG. 15, a flow diagram illustrating a second embodiment of a method for measuring the modulation accuracy of a $\pi/4$ DQPSK I-F signal is shown. The I-F signal is derived from a transmitter signal that is down converted and digitized to produce a discrete-time signal fed through the I-F bandpass filter 60 shown in FIG. 15. The clock delay is estimated following the I-F BPF 60. The clock delay is the time interval from the first sample from the I-F BPF to the leading edge of the first full symbol interval following this first sample. To perform the estimation of clock-delay, the modulated I-F signal is squared 62 and fed to the DFT clock-delay estimator 63. The clock-delay estimator is a bandpass filter with a cosine window and tuned to the symbol rate. The output phase of this filter provides an estimate of the clock-delay.

After the clock delay, $\tau$, has been estimated, the I-F signal is resampled 64 by a Nyquist interpolation filter. The purpose of resampling is to provide samples at the detection decision points. To avoid problems with aliasing, the signal is resampled at a rate of five samples per symbol in the preferred embodiment.

After resampling is complete, the signal is fed through a Hilbert transformer 65 to provide the quadrature component of the signal. From the in-phase component, I(k), and the quadrature component, Q(k), the magnitude $$a(k) = SQRT[I^2(k) + Q^2(k)] \quad (22)$$

and phase $$\Theta(k) = \tan^{-1}\left[\frac{Q(k)}{I(k)}\right] - \Omega_o k \quad (23)$$

where $\Omega_o$ is the nominal I-F frequency, are computed (66 and 67). The difference in phase $\Theta(k) - \Theta(k-5)$ is utilized in a detection step 68 to detect the data symbols according to the following table:

| $\Theta(k)-\Theta(k-5)$ | Detected Symbols |
| --- | --- |
| 0 to 90° | 0 0 |
| 90° to 180° | 0 1 |
| −180° to −90° | 1 1 |
| −90° to 0° | 1 0 |

After the data bits are detected, they are correlated 69 with a unique 28 bit synchronization word to establish word synchronization. This establishes the sequence of detected bits used in the synthesis of the reference signals.

After the data bits are detected and timing established, Nyquist and root-Nyquist reference signals are synthesized 70 and root-Nyquist reference amplitude $a_{ref}(k)$ and reference phase $\Theta_{ref}(k)$ are calculated. $\Theta_{ref}(k)$ is subtracted 71 from the measured phase $\Theta(k)$ to produce the phase differences $\Delta\Theta(k)$. The measured amplitude, a(k), reference amplitude and phase difference are the inputs to the parameter estimator 72 that calculates estimates of transmitter amplitude scale factor, $A_o$, phase, $\Theta_o$, frequency error, $\Delta\Omega_o$, I-component offset, $I_o$, Q-component offset, $Q_o$, and amplitude droop factor, $\sigma_o$ (as detailed in the following Appendix).

The parameter estimator determines the optimal values of $A_o$, $\Theta_o$, $\Delta\Omega_o$, $I_o$, $Q_o$, and $\sigma_o$ to minimize the error function (mean-square error-vector magnitude)

$$\overline{\epsilon^2} = \sum_{k \text{ (decision points)}} [I_{ref}(k) - A_o e^{\sigma_o k} I_1(k) + I_o]^2 + \sum_{k \text{ (decision points)}} [Q_{ref}(k) - A_o e^{\sigma_o k} Q_1(k) + Q_o]^2 \quad (24)$$

where the summations are over the set of decision points and $I_1(k)$ and $Q_1(k)$ are the in-phase and quadrature components of the transmitter signal that has been down converted to baseband by mixing the signal from a coherent local oscillator 73 in mixer 74.

$$cos[(\Omega_o + \Delta\Omega)k + \Theta_o] \quad (25)$$

and $$-sin[(\Omega_o + \Delta\Omega)k + \Theta_o] \quad (26)$$

and retaining the difference frequency term with root-Nyquist low-pass filters 76. $I_{ref}(k)$ and $Q_{ref}(k)$ are the in-phase and quadrature components of the Nyquist reference signal.

The output of the root-Nyquist filters 76

$$I(k) = A_o e^{\sigma_o k} I_1(k) - I_o \quad (27)$$

and $$Q(k) = A_o e^{\sigma_o k} Q_1(k) - Q_o \quad (28)$$

and the baseband signal components representing the transmitter signal after it is scaled in amplitude by $A_o$, compensated for droop by the factor $e^{\sigma_o k}$, corrected for I/Q offset by subtracting (blocks 75) $I_o$ and $Q_o$, and then passed through root-Nyquist filters 76. At this point, I(k) and Q(k) are the baseband components of the compensated transmitter signal with full Nyquist filtering. (The full Nyquist filtering is a result of the cascading of a root-Nyquist filter in the transmitter with the root-Nyquist filters 76 in the receiver.)

The vector-error magnitude is given as a function of time (k) as $$E(k) = SQRT\{[I_{ref}(k) - I(k)]^2 + [Q_{ref}(k) - Q(k)]^2\} \quad (29)$$

and the RMS vector-error magnitude is given as $$E_{RMS} = SQRT\left[(1/K) \sum_k \epsilon^2(k)\right] \quad (30)$$

where K is the total number of decision points used in calculating the RMS vector-error magnitude. At this point, the vector-error magnitude and RMS vector-error magnitude can be calculated (block 77) and provided as output.

If more accurate values of the optimal transmitter parameters are desired, then new values of a(k) and Θ(k) are calculated (block 66). Data bits are again detected and compared with previously detected data bits to check for detection errors. Detection errors will be very rare, but if they do occur, the operator has two choices. He may execute an additional iteration of the procedure to recalculate the parameters, or he may abort the test and capture a new set of data. If no bit errors are detected, it is unnecessary to calculate new components for the root-Nyquist and Nyquist reference signals. This time around, $a_{ref}(k)$ and $\Theta_{ref}(k)$ for the Nyquist reference signal are utilized.

$\Theta_{ref}(k)$ is subtracted from Θ(k) to produce a new phase difference function ΔΘ(k). The amplitude reference, $a_{ref}(k)$, and new magnitude and phase difference functions a(k) and Θ(k) provide the input to the transmitter parameter estimator of the transmitter signal parameters. The operations in blocks 73, 74, 75, 76 and 77 are repeated to obtain refined values for the vector-error magnitude and the RMS value of the vector-error magnitude.

Additional iterations of the calculations described above can be performed to improve measurement accuracy even further. This would be unnecessary, however, unless the transmitter errors were extremely large, so that initial parameter estimates were grossly in error. If this were the case, then it also may be necessary to refine the estimate of clock delay by minimizing the mean-square vector-error magnitude with respect to clock delay. The basic procedure described above can still be used for this additional refinement. Such a noisy transmitter as mentioned here would be far out of specification so that the additional refinements mentioned in this paragraph are not anticipated.

After the calculations outlined in FIG. 15 are completed and the various functions are stored in arrays, the following functions are available and may be displayed on a CRT or printer output:

| | |
|---|---|
| I(k), In-phase component | |
| Q(k), Quadrature component | Baseband, magnitude |
| a(k), Magnitude | corrected, |
| Θ(k), phase | root-Nyquist |
| ΔΘ(k), phase-difference | filtered, |
| $E_\Theta$(k), phase error | transmitter signal |
| $E_\Delta$(k), magnitude error | |
| E(k), vector-error magnitude | |

In addition, the following parameter values may be displayed:
$\Delta\Omega_o$, transmitter frequency error
$\sigma_o$, transmitter magnitude droop factor
$I_o, Q_o$, transmitter I/Q offset
$E_{RMS}$, RMS vector-error magnitude.

APPENDIX

The following part of the specification details the procedure that is performed to provide an optimized estimate of the parameters of the measured signal. (For expository convenience, the derivations are provided for the case where the reference signal has a magnitude of 1 at the decision point. The more general case may be similarly derived.)

The reference and measured signals are given in terms of their complex envelopes as

| | |
|---|---|
| Reference Signal: | |
| $s_r(k) = a_r(k)e^{j\theta_r(k)}$ | (31) |
| Measured Signal: | |
| $s_m(k) = a_m(k)e^{j\theta_m(k)}$ | (32) |

The discrete time variable "k" refers to the kth decision point. The amplitudes $a_r(k)$ and $a_m(k)$ and the phase terms $\theta_r(k)$ and $\theta_m(k)$ are calculated in the signal-phasor and reference-signal subroutines.

The measured signal is compensated by multiplying by the factor $$A_o e^{\sigma_o k - j[\Omega_o k + \theta_o]} \quad (33)$$

to produce $$A_o a_m(k)e^{\sigma_o k - j[\Omega_o k + \theta_o - \theta_m(k)]} - B_o \quad (34)$$

where
$A_o$ is amplitude scale factor
$\sigma_o$ is amplitude droop factor
$\Omega_o$ is frequency error
$\theta_o$ is a fixed phase term
$B_o = I_o + jQ_o$ is I/Q offset
The mean-square error averaged over the decision points is given as (note $a_a(k) = 1$ for Nyquist):

$$\overline{\epsilon^2} = \sum_k \left| A_o a_m(k)e^{\sigma_o k - j[\Omega_o k + \theta_o - \theta_m(k)]} - B_o - e^{j\theta_r(k)} \right|^2 \quad (35)$$

The objective is to find the value of the parameters $A_o, \sigma_o, \Omega_o, \theta_o$ and $B_o$ to minimize $\overline{\epsilon^2}$.

In terms of in-phase and quadrature components, $\overline{\epsilon^2}$ can be written as $$\overline{\epsilon^2} = \sum_k [A_o a_m e^{\sigma_o k} \cos[\Omega_o k + \theta_o - \theta_m(k)] - I_o - \cos\theta_r(k)]^2 + \quad (36)$$

-continued $$\sum_k [A_o a_m(k)e^{\sigma_o k}\sin[\Omega_o k + \theta_o - \theta_m(k)] - Q_o - \sin\theta_r(k)]^2$$

The minimization procedure is performed in several steps:

Minimization Steps (i) Set $B_o=0$ and find optimal values for $A_o$, $\theta_o$, $\sigma_o$ and $\Omega_o$. (The expression for these optimal values are given in step ii).

After these values are found they are used to calculate $I_o$ and $Q_o$ as $$I_o = \frac{1}{K} \sum_k A_o a_m(k)e^{\sigma_o k}\cos[\Omega_o k - \theta_o - \theta_m(k)] - \cos\theta_r(k) \quad (37)$$

and $$Q_o = \frac{1}{K} \sum_k A_o a_m(k)e^{\sigma_o k}\sin[\Omega_o k - \theta_o - \theta_m(k)] - \sin\theta_r(k) \quad (38)$$

Equations (37) and (38) were obtained by setting the first derivatives of $\overline{\epsilon^2}$ given by (36) with respect to $I_o$ and $Q_o$ to zero and solving for $I_o$ and $Q_o$.

It should be noticed that $I_o$ and $Q_o$ given by (37) and (38) are simply the averages of the differences in the measured and reference in-phase and quadrature components of the signal.

After the optimal values of $A_o$, $\Omega_o$, $\theta_o$, $I_o$ and $Q_o$ are found, they are applied to the signal to produce a new measured signal $$a_m(k)e^{j\theta_m(k)} \quad (39)$$

to be used in step (ii) of the minimization procedure.

(ii) For this step of the procedure we will reconsider equation (35) in which we define new terms to simplify notation.

$$B(k)=A_o a_m(k)e^{\sigma_o k} \quad (40)$$

$$\gamma(k)=\theta_m(k)-\Omega_o k-\theta_o \quad (41)$$

We may now write equation (35) as $$\overline{\epsilon^2} = \sum_k [|B(k)e^{j\gamma(k)} - B_o - e^{j\theta_r(k)}|^2 \quad (42)$$

If we define $$B_o+e^{j\theta_r(k)}=C(k)e^{j\phi_r(k)} \quad (43)$$

then $$\begin{aligned}\overline{\epsilon^2} &= \sum_k [|B(k)e^{j\gamma(k)} - C(k)e^{j\phi_r(k)}|^2 \quad (44)\\ &= \sum_k |B(k)|^2 + |C(k)|^2 - 2R_e B(k)C(k)e^{j[\gamma(k)-\phi_r(k)]}\\ &= \sum_k |B(k)|^2 + |C(k)|^2 -\\ &\quad 2B(k)C(k)\cos[\gamma(k) - \phi_r(k)]\end{aligned}$$

Since $|\gamma(k)-\phi(k)|$ will be small $$\cos[\gamma(k)-\phi_r(k)]\approx 1-\tfrac{1}{2}[\gamma(k)-\phi_r(k)]^2 \quad (45)$$

Equation (44) can be approximated as $$\overline{\epsilon^2} = \sum_k [|B(k)|^2 - 2B(k)C(k) + B(k)C(k)[\gamma(k) - \phi_r(k)]^2 \quad (46)$$

or $$\overline{\epsilon^2} = \sum_k [B(k) - C(k)]^2 + B(k)C(k)[\gamma(k) - \phi_r(k)]^2$$

We write $$B(k)=e^{\ln B(k)}$$

and $$C(k)=e^{\ln C(k)}$$

so that $$\overline{\epsilon^2} = [e^{\ln B(k)} - e^{\ln C(k)}]^2 + B(k)C(k)[\gamma(k) - \phi_r(k)]^2 \quad (47)$$

$$\epsilon^2 = \sum_k e^{\ln B(k)+\ln C(k)} [e^{\frac{\ln B(k)-\ln C(k)}{2}} - e^{\frac{-\ln B(k)+\ln C(k)}{2}}] +$$

$$B(k)C(k)[\gamma(k) - \phi_r(k)]^2$$

or $$\overline{\epsilon^2} = \sum_k B(k)C(k)\{4\sinh^2[\frac{\ln B(k)-\ln C(k)}{2}] + [\gamma(k) - \phi_r(k)]^2\} \quad (48)$$

Consider $\sinh^2 x = \tfrac{1}{2}[\cosh(2x) - 1]$ $$\cosh(2x) = \frac{e^{2x} + e^{-2x}}{2} \approx$$

$$\frac{1 + 2x + \frac{(2x)^2}{2} + 1 - 2x + \frac{(2x)^2}{2}}{2} \approx 1 + 2x^2$$

$$\sinh^2 \approx x^2 \quad (49)$$

Using (49) in (48) we obtain the approximation $$\epsilon^2 = \sum_k B(k)C(k)\{[\ln B(k) - \ln C(k)] + \gamma(k) - \phi_r(k)]^2\} \quad (50)$$

From (48)

$$\ln B(k)=\ln A_o+\ln a_m(k)+\sigma_o k$$

From (43)

$$\begin{aligned}C(k) &= \sqrt{[I_o + \cos\theta_r(k)]^2 + [Q_o + \sin\theta_r(k)]^2}\\ &= \sqrt{I_o^2 + Q_o^2 + 1 + 2I_o\cos\theta_r(k) + 2Q_o\sin\theta_r(k)}\end{aligned}$$

But since the I/Q offset was removed during step (i) $I_o^2+Q_o^2<<1$ so that $$C(k) \simeq \sqrt{1 + 2I_o\cos\theta_r(k) + 2Q_o\sin\theta_r(k)}$$

or $$C(k) \simeq 1 + I_o\cos\theta_r(k) + Q_o\sin\theta_r(k) \quad (51)$$

$$\ln C(k) \simeq I_o\cos\theta_r(k) + Q_o\sin\theta_r(k) \quad (52)$$

$$\gamma(k) = \theta_m(k) - \Omega_o k - \theta_o \quad (53)$$

and $$\phi(k) = \tan^{-1}\left[\frac{Q_o + \sin\theta_r(k)}{I_o + \cos\theta_r(k)}\right] \quad (54)$$

Since $I_o$ and $Q_o$ are very small, they will have little effect on the minimization of (50) with respect to $A_o$, $\sigma_o$, $\Omega_o$ and $\theta_o$. The procedure, therefore, is initially to set $I_o$ and $Q_o$ to zero, minimize $\overline{\epsilon^2}$ with respect to the other parameters and then calculate optimal values for $I_o$ and $Q_o$ as given by equations (37) and (38).

With $I_o = 0$ and $Q_o = 0$ $$C(k) = 1, \quad B(k) = a_m(k)e^{\sigma_o k} \quad (A_o \text{ dropped})$$

$$\ln C(k) = 0$$

and $$\phi_r(k) = \theta_r(k) \quad (55)$$

(50) becomes (with $A_o$ dropped):

$$\overline{\epsilon^2} = \sum_k [a_m(k)e^{\sigma_o k}\{[\ln A_o + \ln a_m(k) + \sigma_o k]^2 + \quad (56)$$

$$[\theta_m(k) - \theta_r(k) - \Omega_o k - \theta_o]^2\}$$

We see that $\overline{\epsilon^2}$ is a weighted squared difference in which the weighting involves $\sigma_o$, one of the parameters to be estimated. The recommended procedure is as follows:

Use two iterations in which the first iteration is taken with $\sigma_o = 0$. We estimate $\sigma_o$ from the first iteration and include this estimate in the weighting factor for the second iteration.

We write (56) as $$\overline{\epsilon^2} = \sum_k [a_m(k)e^{\sigma_{oj}k}\{[\ln A_o + \ln a_m(k) + \sigma_{oj}k]^2 + \quad (57)$$

$$[\theta_d(k) - \Omega_o k - \theta_o]^2\}$$

where $\sigma_{oo} = 0$, $i = j - 1$, $j$ is the iteration no. $\theta_d(k) = \theta_m(k) - \theta_r(k)$.

To find the optimal values of $A_o$, $\sigma_{oj}$, $\Omega_o$ and $\theta_o$, we take first partial derivatives set equal to zero.

$$\frac{2\overline{\epsilon^2}}{2(\ln A_o)} = 2\sum_k a_m(k)e^{\sigma_{oj}k}[\ln A_o + \ln a_m(k) + \sigma_{oj}k] = 0 \quad (58)$$

$$\frac{2\overline{\epsilon^2}}{2\sigma_{oj}} = 2\sum_k k a_m(k)e^{\sigma_{oj}k}[\ln A_o + \ln a_m(k) + \sigma_{oj}k] = 0$$

$$\frac{2\overline{\epsilon^2}}{2\theta_o} = -2\sum_k k a_m(k)e^{\sigma_{oj}k}[\theta_d(k) - \Omega_o k - \theta_o] = 0$$

$$\frac{2\overline{\epsilon^2}}{2\Omega_o} = -2\sum_k k a_m(k)e^{\sigma_{oj}k}[\theta_d(k) - \Omega_o k - \theta_o] = 0$$

We have two pairs of equations which we can solve for the desired parameter values.

$$\ln A_o \sum_k a_m(k)e^{\sigma_{oj}k} + \sigma_{oj}\Sigma k a_m(k)e^{\sigma_{oj}k} = -\sum_k a_m(k)\ln[a_m(k)]e^{\sigma_{oj}k} \quad (59)$$

$$\ln A_o \sum_k k a_m(k)e^{\sigma_{oj}k} + \sigma_{oj}\Sigma k^2 a_m(k)e^{\sigma_{oj}k} = -\sum_k k a_m(k)\ln[a_m(k)]e^{\sigma_{oj}k}$$

$$\theta_o \sum_k a_m(k)e^{\sigma_{oj}k} + \Omega_o\Sigma k a_m(k)e^{\sigma_{oj}k} = \sum_k a_m(k)\theta_d(k)e^{\sigma_{oj}k}$$

$$\theta_o \sum_k k a_m(k)e^{\sigma_{oj}k} + \Omega_o\Sigma k^2 a_m(k)e^{\sigma_{oj}k} = \sum_k k a_m(k)\theta_d(k)e^{\sigma_{oj}k}$$

Solving equation (59) we obtain the desired estimator equations:

$$\ln A_o = \Sigma k a_m(k)e^{\sigma_{oj}k}\Sigma k a_m(k)\ln[a_m(k)]e^{\sigma_{oj}k} \frac{-\Sigma k^2 a_m(k)e^{\sigma_{oj}k}\Sigma a_m(k)\ln[a_m(k)]e^{\sigma_{oj}k}}{\Sigma a_m(k)e^{\sigma_{oj}k}\Sigma k^2 a_m(k)e^{\sigma_{oj}k} - (\Sigma k a_m(k)e^{\sigma_{oj}k})^2} \quad (60a)$$

$$A_o = \exp[\ln A_o]$$

$$\sigma_{oj} = \frac{-\Sigma a_m(k)\ln[a_m(k)]e^{\sigma_{oj}k} - \ln A_o \Sigma a_m(k)e^{\sigma_{oj}k}}{\Sigma k a_m(k)e^{\sigma_{ij}k}} \quad (60b)$$

$$\Omega_o = \frac{\Sigma a_m(k)\theta_d(k)e^{\sigma_{oj}k} - \theta_o\Sigma a_m^{\sigma_{oj}k}}{\Sigma k a_m(k)e^{\sigma_{oj}k}} \quad (60c)$$

$$\theta_o = \Sigma a_m(k)\theta_d(k)e^{\sigma_{ij}k}\Sigma k^2 a_m(k)e^{\sigma_{oj}k} \frac{-\Sigma k a_m(k)e^{\sigma_{oj}k}\Sigma k a_m(k)\theta_d(k)e^{\sigma_{oj}k}}{\Sigma a_m(k)e^{\sigma_{oj}k}\Sigma k^2 a_m(k)e^{\sigma_{oj}k} - (\Sigma k a_m(k)e^{\sigma_{oj}k})^2} \quad (60d)$$

| Accuracy of Approximations* ||||
|---|---|---|---|
| $\theta m$ | $\cos\theta_m$ $\simeq$ | $1 \frac{1}{2}\theta^2_m$ | % error |
| 10° | .98481 | .98477 | 0.00415% |
| 20° | .93969 | .93908 | 0.065% |
| 30° | .86603 | .86292 | 0.359% |
| 5° | .996195 | .996192 | 0.00027% |
| $\epsilon$ | $a_m = 1 + E$ $(a_m - 1)^2 \simeq$ | $a_m\ln^2 a_m$ | % error |
| .1 | 1.1 .01 | .009992 | 0.08% |

-continued

| Accuracy of Approximations* | | | | |
|---|---|---|---|---|
| .2 | 1.2 | .04 | .03989 | 0.276% |
| .3 | 1.3 | .09 | .08949 | 0.572% |
| .05 | 1.05 | .0025 | .0024995 | 0.0198% |

*Note:
These are errors in how the error functional weights magnitude and phase errors. The errors in the estimates of optimal signal paraeters will be much less than those given above.

Having described and illustrated the principles of our invention with reference to two preferred embodiments, it will be apparent that the invention can be modified in arrangement and detail without departing from such principles. In view of the many possible embodiments to which the principles of our invention may be put, it should be recognized that the detailed embodiments are illustrative only and should not be taken as limiting the scope of our invention. Rather, we claim as our invention all such embodiments as may come within the scope and spirit of the following claims and equivalents thereto.

We claim:

1. A method for measuring modulation accuracy of a transmitted signal that is modulated in accordance with a data signal, the method comprising the steps of:
    processing the transmitted signal to obtain a digitized representation thereof;
    further processing the digitized representation of the transmitted signal in a digital signal processor to detect parameters of the transmitted signal including data clock phase and data sequence;
    using the detected data sequence in determining characteristics of a reference signal corresponding to the transmitted signal;
    determining first signal components as functions of time for the reference signal and for the transmitted signal; and
    using said first signal components to compare the reference and transmitted signals so as to determine errors of the transmitted signal as a function of time.

2. The method of claim 1 which further includes determining first and second signal components as functions of time for both the reference signal and the transmitted signal; and
    using the first and second components to compare the reference and transmitted signals so as to determine errors of the transmitted signal as functions of time.

3. The method of claim 2 in which the step of further processing to detect the parameter of data clock phase includes:
    multiplying the digitized representation by itself to produce a squared signal, said squared signal having a discrete spectral line at a clock frequency;
    filtering the squared signal with a linear phase filter centered at the clock frequency to produce a filtered signal;
    calculating a phase of the filtered signal; and
    relating the calculated phase of the filtered signal to the data clock phase.

4. The method of claim 2 which includes selecting parameters of the reference signal, including clock phase, data sequence, carrier frequency, carrier phase, and amplitude scale factor, that optimize a performance measure.

5. The method of claim 4 which further includes:
    comparing the transmitted and reference signals to produce a vector error; and
    determining an RMS magnitude value of the vector error over time, said RMS magnitude value serving as the performance measure.

6. The method of claim 5 which further includes compensating one of the transmitted or reference signals to optimize the performance measure.

7. The method of claim 4 which further includes:
    determining an RMS phase error, said determining step including computing a difference between the transmitted signal phase and the reference signal phase as a function of time;
    averaging said RMS phase error over time; and
    using said average as the performance measure.

8. The method of claim 7 which further includes compensating one of the transmitted or reference signals to optimize the performance measure.

9. The method of claim 4 in which the selected parameters of the reference signal further include amplitude droop factor and I/Q offset.

10. The method of claim 9 which further includes:
    comparing the transmitted and reference signals to produce a vector error; and
    determining an RMS magnitude value of the vector error over time, said RMS magnitude value serving as the performance measure.

11. The method of claim 9 which further includes:
    determining an RMS phase error, said determining step including computing a difference between the transmitted signal phase and the reference signal phase as a function of time;
    averaging said RMS phase error over time; and
    using said average as the performance measure.

12. The method of claim 2 which further includes:
    processing the transmitted signal to produce sampled phase and magnitude data;
    subtracting samples corresponding to a phase of a carrier frequency of the transmitted signal from the sampled phase data to produce baseband phase data of the transmitted signal;
    detecting a data sequence from the baseband phase data;
    correlating the detected data sequence with a synchronization word;
    calculating phase and magnitude data corresponding to the reference signal; and
    estimating at least one of the following parameters: transmitter amplitude scale factor, transmitter phase, transmitter frequency error, I-component offset, Q-component offset, and amplitude droop factor, from the phase and amplitude data corresponding to the reference signal, and from the baseband phase data of the transmitted signal.

13. The method of claim 12 which further includes:
    down-converting the transmitted signal to an intermediate frequency (I-F);
    digitizing the I-F frequency to produce digital I-F data corresponding thereto;
    bandpass filtering said digital I-F data;
    resampling the digital I-F data at a rate sufficient to avoid aliasing;
    determining magnitude and phase components of the resampled I-F data;
    subtracting data corresponding to a phase of an I-F carrier frequency from the resampled I-F phase data to produce baseband phase data; and estimating from the phase and magnitude data corresponding to the reference signal, from the baseband phase data, and from the magnitude component of the resampled I-F data, at least one of the following parameters: transmitter amplitude scale factor, transmitter phase, transmitter frequency error, I-component offset, Q-component offset, and amplitude droop factor.

14. The method of claim 2 which further comprises: estimating parameters of the reference signal including an amplitude scale factor, an amplitude droop factor, a frequency error term, and a fixed phase term, by minimizing a mean square error parameter expressed by the following equation:

$$\sum_k [a_m(k)e^{\sigma_o k}\{[\ln A_o + \ln a_m(k) + \sigma_o k]^2 + [\theta_m(k) - \theta_r(k) - \Omega_o k - \theta_o]^2\}$$

where:
$a_m(k)$ is a measured amplitude of the transmitted signal;
$\sigma_o$ is the amplitude droop factor;
$A_o$ is the amplitude scale factor;
$\eta_m(k)$ is a measured phase of the transmitted signal;
$\theta_r(k)$ is a phase of the reference signal;
$\Omega_o$ is the frequency error term; and
$\theta_o$ is the fixed phase term.

15. The method of claim 2 which further includes determining an I/Q offset $B_o = I_o + jQ_o$, where:

$$I_o = \frac{1}{K} \sum_k A_o a_m(k)e^{\sigma_o k}\cos[\Omega_o k - \theta_o - \theta_m(k)] - \cos\theta_r(k);$$

$$Q_o = \frac{1}{K} \sum_k A_o a_m(k)e^{\sigma_o k}\sin[\Omega_o k - \theta_o - \theta_m(k)] - \sin\theta_r(k);$$

$a_m(k)$ is a measured amplitude of the transmitted signal;
$\sigma_o$ is an amplitude droop factor;
$A_o$ is an amplitude scale factor;
$\theta_m(k)$ is a measured phase of the transmitted signal;
$\theta_r(k)$ is a phase of the reference signal;
$\Omega_o$ is a frequency error term; and
$\theta_o$ is a fixed phase term.

16. The method of claim 2 which further includes the steps:
(a) finding values for $A_o$, $\theta_o$, $\sigma_o$ and $\Omega_o$ according to the following equations for the case $\sigma_o = 0$; and
(b) finding values for $A_o$, $\theta_o$, $\sigma_o$ and $\Omega_o$ according to the following equations using the value of $\sigma_o$ computed in step (a):

$$\ln A_o = \Sigma k a_m(k)e^{\sigma_{oj} k} \Sigma k a_m(k)\ln[a_m(k)]e^{\sigma_{oj} k} \frac{- \Sigma k^2 a_m(k)e^{\sigma_{oj} k}\Sigma a_m(k)\ln[a_m(k)]e^{\sigma_{oj} k}}{\Sigma a_m(k)e^{\sigma_{oj} k}\Sigma k^2 a_m(k)e^{\sigma_{oj} k} - (\Sigma k a_m(k) e^{\sigma_{oj} k})^2}$$

$$A_o = \exp[\ln A_o]$$

$$\sigma_{oj} = \frac{- \Sigma a_m(k)\ln[a_m(k)]e^{\sigma_{oj} k} - \ln A_o \Sigma a_m(k)e^{\sigma_{oj} k}}{\Sigma k a_m(k)e^{\sigma_{oj} k}}$$

$$\Omega_o = \frac{\Sigma a_m(k)\theta_d(k) e^{\sigma_{oj} k} - \theta_o \Sigma a_m^{\sigma_{oj} k}}{\Sigma k a_m(k)e^{\sigma_{oj} k}}$$

$$\theta_o = \Sigma a_m(k)\theta_d(k)e^{\sigma_{oj} k}\Sigma k^2 a_m(k)e^{\sigma_{oj} k} \frac{- \Sigma k a_m(k)e^{\sigma_{oj} k}\Sigma k a_m(k)\theta_d(k)e^{\sigma_{oj} k}}{\Sigma a_m(k)e^{\sigma_{oj} k}\Sigma k^2 a_m(k)e^{\sigma_{oj} k} - (\Sigma k a_m(k)e^{\sigma_{oj} k})^2}$$

where:
$a_m(k)$ is a measured amplitude of the transmitted signal;
$\sigma_o$ is an amplitude droop factor;
$A_o$ is an amplitude scale factor;
$\theta_m(k)$ is a measured phase of the transmitted signal;
$\theta_r(k)$ is a phase of the reference signal;
$\Omega_o$ is a frequency error term; and
$\theta_o$ is a fixed phase term.

* * * * *

UNITED STATES PATENT AND TRADEMARK OFFICE
CERTIFICATE OF CORRECTION

PATENT NO. : 5,187,719

DATED : February 16, 1993

INVENTOR(S) : Raymond A. Birgenheier et al.

It is certified that error appears in the above-identified patent and that said Letters Patent is hereby corrected as shown below:

Col. 6, l. 6 - delete "T" and insert therefor --$T_s$--;

Col. 10, l. 42 - before "difference" insert --phase--;

Col. 18, l. 21 - delete "-$2\Sigma_k ka_m$" and insert therefor --$-2\Sigma_k a_m$--; and Col. 21, l. 43 - delete "$\eta_m(k)$" and insert therefor --$\theta_m(k)$--.

Col. 18, line 24 "-2" should read -- -2 --.

Signed and Sealed this

Thirtieth Day of May, 1995

*Attest:*

BRUCE LEHMAN

*Attesting Officer*  *Commissioner of Patents and Trademarks*